US012159677B2

(12) United States Patent
Sugahara et al.

(10) Patent No.: US 12,159,677 B2
(45) Date of Patent: Dec. 3, 2024

(54) MEMORY DEVICE WHICH GENERATES OPERATION VOLTAGES IN PARALLEL WITH RECEPTION OF AN ADDRESS

(71) Applicant: Kioxia Corporation, Tokyo (JP)

(72) Inventors: Akio Sugahara, Yokohama Kanagawa (JP); Takaya Handa, Yokohama Kanagawa (JP); Ryosuke Isomura, Matsudo Chiba (JP); Kazuto Uehara, Sagamihara Kanagawa (JP); Junichi Sato, Yokohama Kanagawa (JP); Norichika Asaoka, Yokohama Kanagawa (JP); Masashi Yamaoka, Yokohama Kanagawa (JP); Bushnaq Sanad, Yokohama Kanagawa (JP); Yuzuru Shibazaki, Fujisawa Kanagawa (JP); Noriyasu Kumazaki, Kawasaki Kanagawa (JP); Yuri Terada, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 18/205,915

(22) Filed: Jun. 5, 2023

(65) Prior Publication Data

US 2023/0317177 A1 Oct. 5, 2023

Related U.S. Application Data

(63) Continuation of application No. 17/570,676, filed on Jan. 7, 2022, now Pat. No. 11,705,210, which is a (Continued)

(30) Foreign Application Priority Data

Dec. 25, 2018 (JP) ................................ 2018-241544

(51) Int. Cl.
*G11C 16/30* (2006.01)
*G11C 16/04* (2006.01)
(Continued)

(52) U.S. Cl.
CPC .......... *G11C 16/30* (2013.01); *G11C 16/0483* (2013.01); *G11C 16/08* (2013.01);
(Continued)

(58) Field of Classification Search
CPC ..... G11C 16/30; G11C 16/0483; G11C 16/08; G11C 16/12; G11C 16/26; G11C 16/32; H10B 69/00
See application file for complete search history.

(56) References Cited

U.S. PATENT DOCUMENTS 6,122,196 A 9/2000 Tanaka et al.
7,283,405 B2 10/2007 Yamanaka et al.
(Continued)

FOREIGN PATENT DOCUMENTS

JP 4214978 B2 9/2004
JP 4984666 B2 6/2006
(Continued)

OTHER PUBLICATIONS

Notice of Allowance dated Oct. 14, 2021, issued in U.S. Appl. No. 17/168,822.

(Continued)

*Primary Examiner* — Son L Mai
(74) *Attorney, Agent, or Firm* — Holtz, Holtz & Volek PC

(57) ABSTRACT

A memory device includes a memory cell array, a voltage generation circuit generating one or more voltages supplied to the memory cell array, an input/output circuit receiving an address indicating a region in the memory cell array, and a control circuit controlling operations of the memory cell array. The control circuit supplies a non-selection voltage of
(Continued)

the voltages before a ready/busy signal changes from a ready state to a busy state.

19 Claims, 21 Drawing Sheets

Related U.S. Application Data continuation of application No. 17/168,822, filed on Feb. 5, 2021, now Pat. No. 11,257,551, which is a continuation of application No. 16/567,982, filed on Sep. 11, 2019, now Pat. No. 10,957,404.

(51) Int. Cl.

| | |
|---|---|
| ***G11C 16/08*** | (2006.01) |
| ***G11C 16/32*** | (2006.01) |
| *G11C 16/12* | (2006.01) |
| *G11C 16/26* | (2006.01) |
| *H10B 69/00* | (2023.01) |

(52) U.S. Cl.

CPC .............. *G11C 16/32* (2013.01); *G11C 16/12* (2013.01); *G11C 16/26* (2013.01); *H10B 69/00* (2023.02)

(56) References Cited

U.S. PATENT DOCUMENTS

| | | | | |
|---|---|---|---|---|
| 8,120,953 | B2 | 2/2012 | Tanaka | |
| 8,438,356 | B2 | 5/2013 | Yoon et al. | |
| 8,732,385 | B2 | 5/2014 | Ishimoto | |
| 8,854,890 | B1 | 10/2014 | Miwa | |
| 9,368,166 | B2 | 6/2016 | Kwak et al. | |
| 9,627,069 | B1 * | 4/2017 | Lee | G11C 7/1063 |
| 9,792,996 | B1 | 10/2017 | Date | |
| 9,928,885 | B2 | 3/2018 | Jung | |
| 10,083,729 | B2 | 9/2018 | Noguchi et al. | |
| 10,249,377 | B2 | 4/2019 | Kasai et al. | |
| 10,796,771 | B1 | 10/2020 | Yamaoka | |
| 10,860,250 | B2 | 12/2020 | Sugahara et al. | |
| 10,896,735 | B2 | 1/2021 | Sanad et al. | |
| 10,957,404 | B2 | 3/2021 | Sugahara et al. | |
| 2009/0267128 | A1 | 10/2009 | Maejima | |
| 2009/0268522 | A1 | 10/2009 | Maejima | |
| 2010/0207195 | A1 | 8/2010 | Fukuzumi et al. | |
| 2010/0214838 | A1 | 8/2010 | Hishida et al. | |
| 2011/0284946 | A1 | 11/2011 | Kiyotoshi | |
| 2012/0069663 | A1 | 3/2012 | Itagaki et al. | |
| 2012/0307557 | A1 | 12/2012 | Itagaki | |
| 2013/0080858 | A1 | 3/2013 | Lee et al. | |
| 2015/0124529 | A1 | 5/2015 | Joo | |
| 2017/0069362 | A1 | 3/2017 | Pekny | |
| 2018/0276070 | A1 | 9/2018 | Lin et al. | |

FOREIGN PATENT DOCUMENTS

| | | | |
|---|---|---|---|
| JP | 3990485 | B2 | 7/2007 |
| JP | 2010140554 | A | 6/2010 |
| JP | 2014137841 | A | 7/2014 |
| JP | 2017216025 | A | 12/2017 |
| TW | 201835934 | A | 10/2018 |

OTHER PUBLICATIONS

Office Action (Non-Final Rejection) dated Jun. 24, 2021, issued in U.S. Appl. No. 17/168,822.

U.S. Appl. No. 17/091,005; First Named Inventor: Akio Sugahara; Title: “Memory Device”; filed Nov. 6, 2020.

U.S. Appl. No. 17/164,273; First Named Inventor: Akio Sugahara; Title: “Semiconductor Memory Device”; filed Feb. 1, 2021.

* cited by examiner

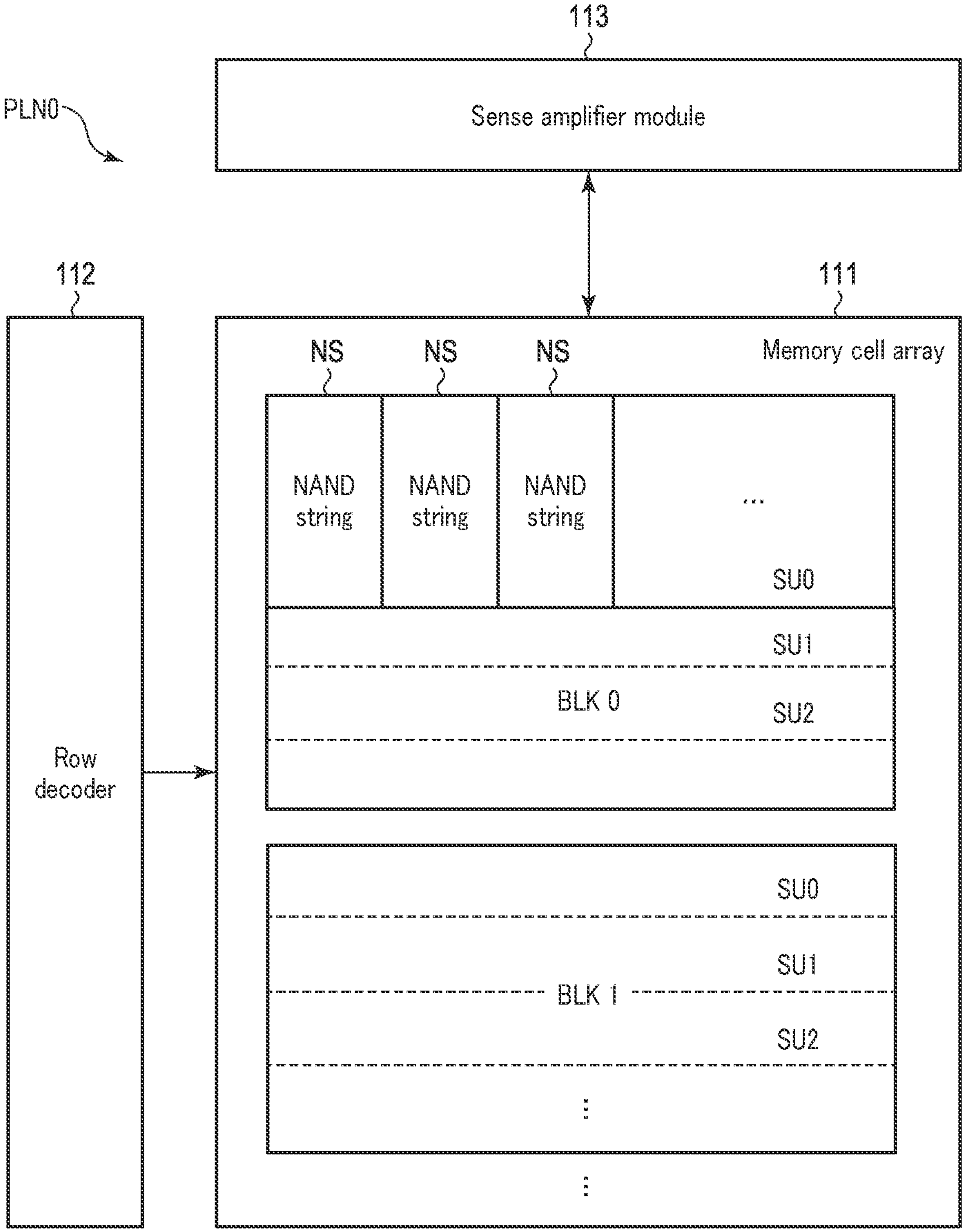
F I G. 3

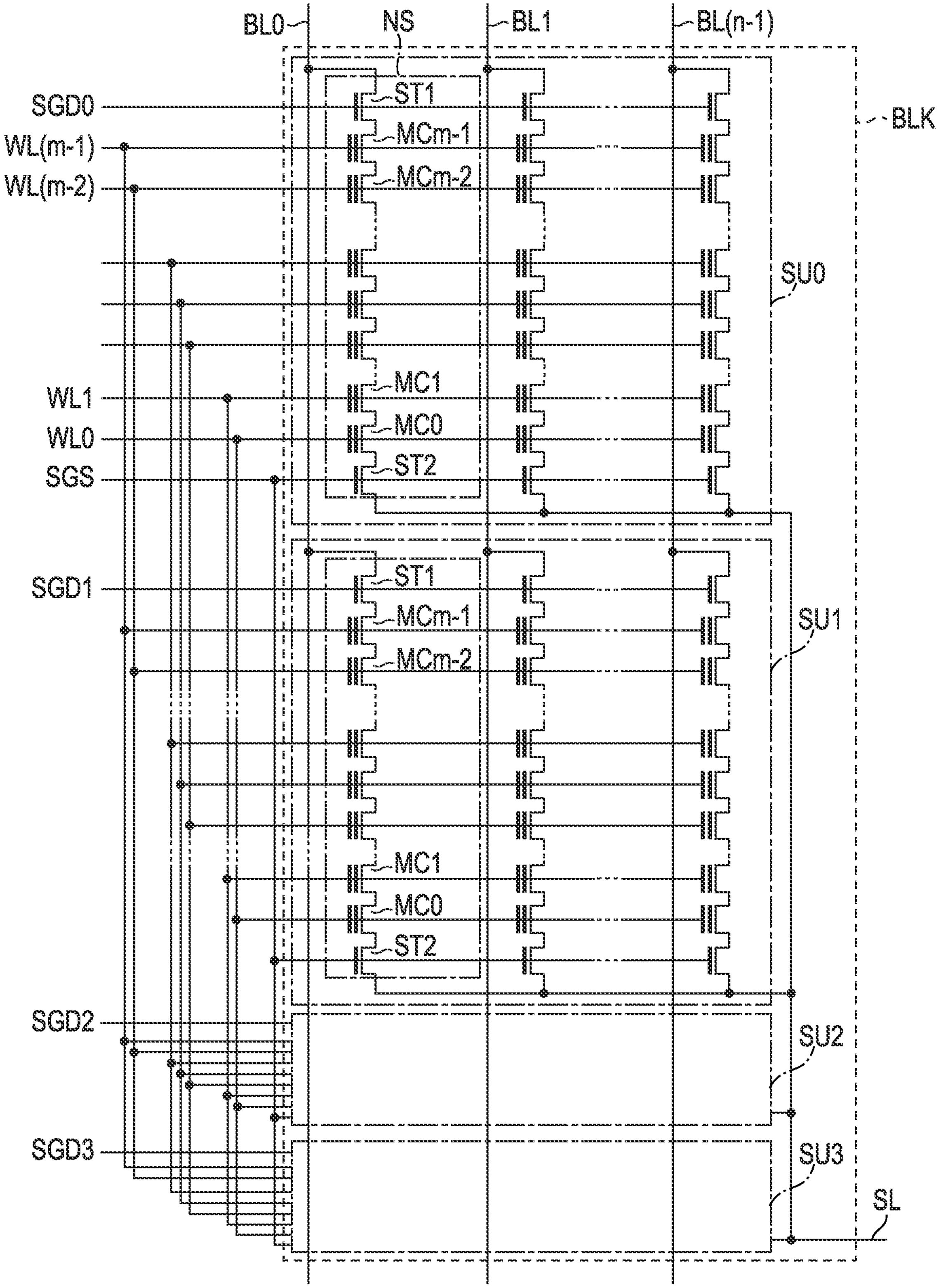
F I G. 4

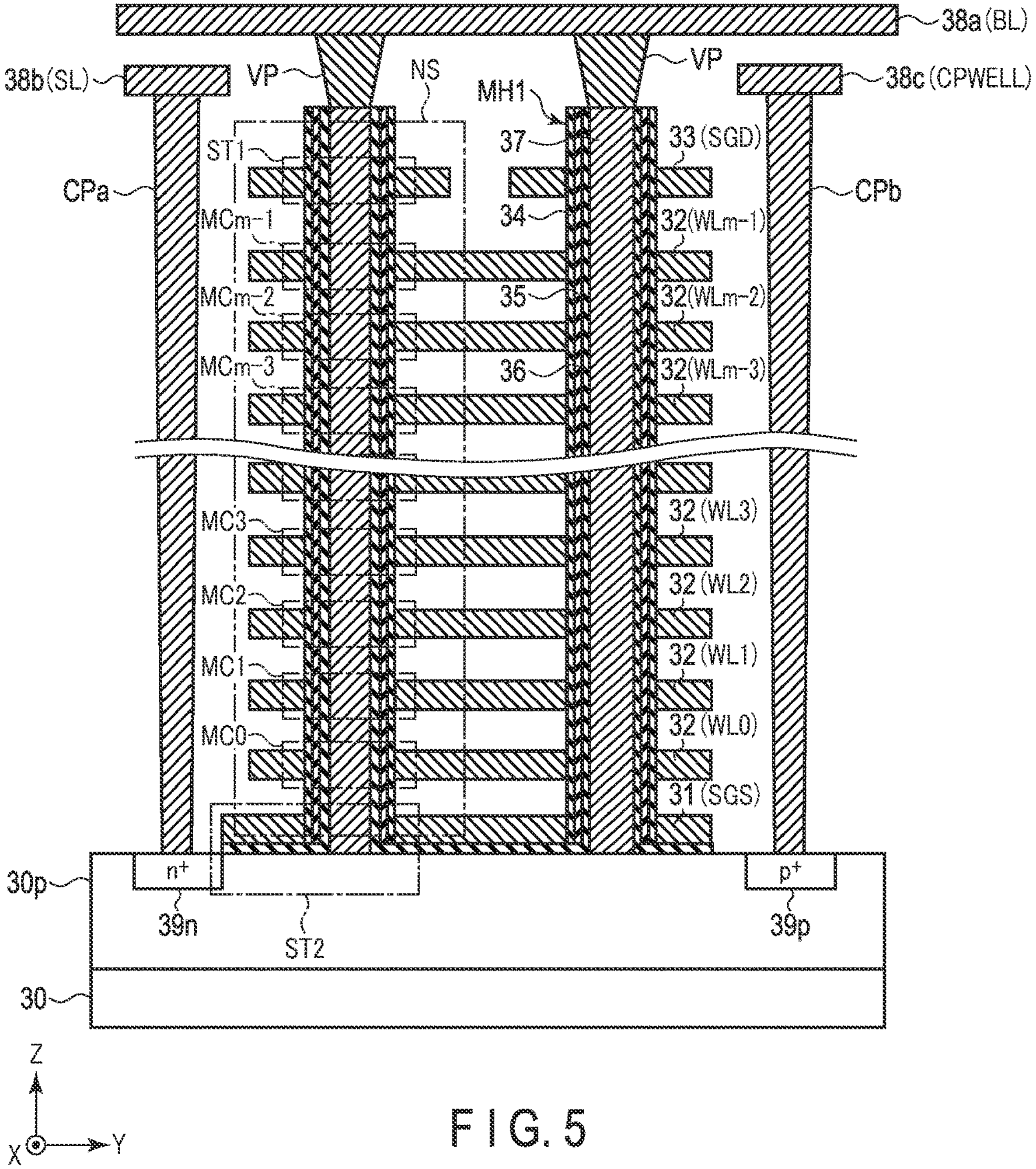
F I G. 5

| Cycle | | I/O7 | I/O6 | I/O5 | I/O4 | I/O3 | I/O2 | I/O1 | I/O0 |
|---|---|---|---|---|---|---|---|---|---|
| Cycle | 1 | A7 | A6 | A5 | A4 | A3 | A2 | A1 | A0 |
| | | Column address | | | | | | | |
| | 2 | A15 | A14 | A13 | A12 | A11 | A10 | A9 | A8 |
| | | Don't Care | | | Column address | | | | |
| | 3 | A23 | A22 | A21 | A20 | A19 | A18 | A17 | A16 |
| | | Word line address | | | | | | String unit address | |
| | 4 | A31 | A30 | A29 | A28 | A27 | A26 | A25 | A24 |
| | | Block address | | | Plane address | | | | Word line address |
| | 5 | A39 | A38 | A37 | A36 | A35 | A34 | A33 | A32 |
| | | Chip address | Block address | | | | | | |
| | 6 | A47 | A46 | A45 | A44 | A43 | A42 | A41 | A40 |
| | | Don't Care | | | | | | Chip address | |

F I G. 7

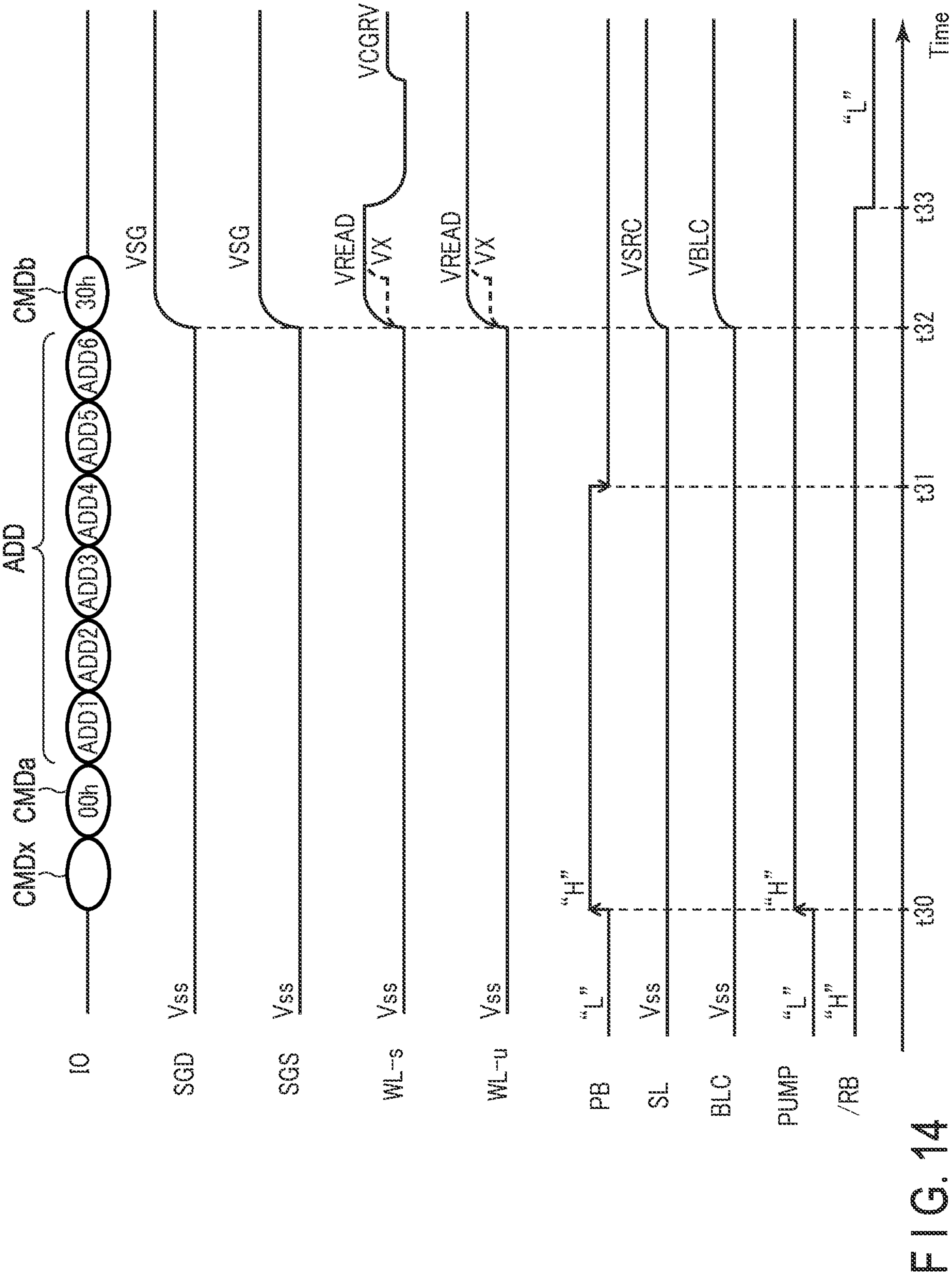
F I G. 14

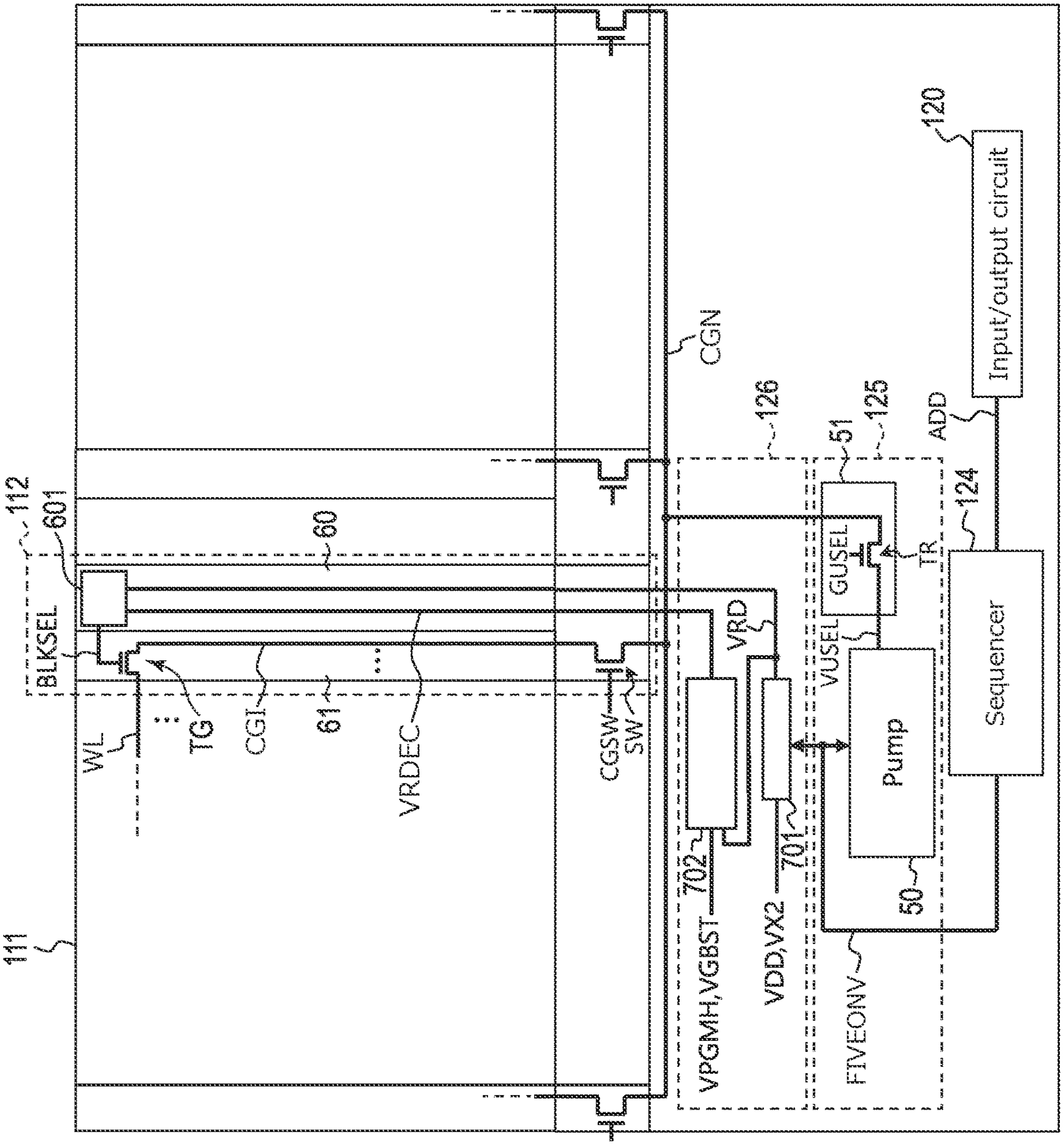
F I G. 16

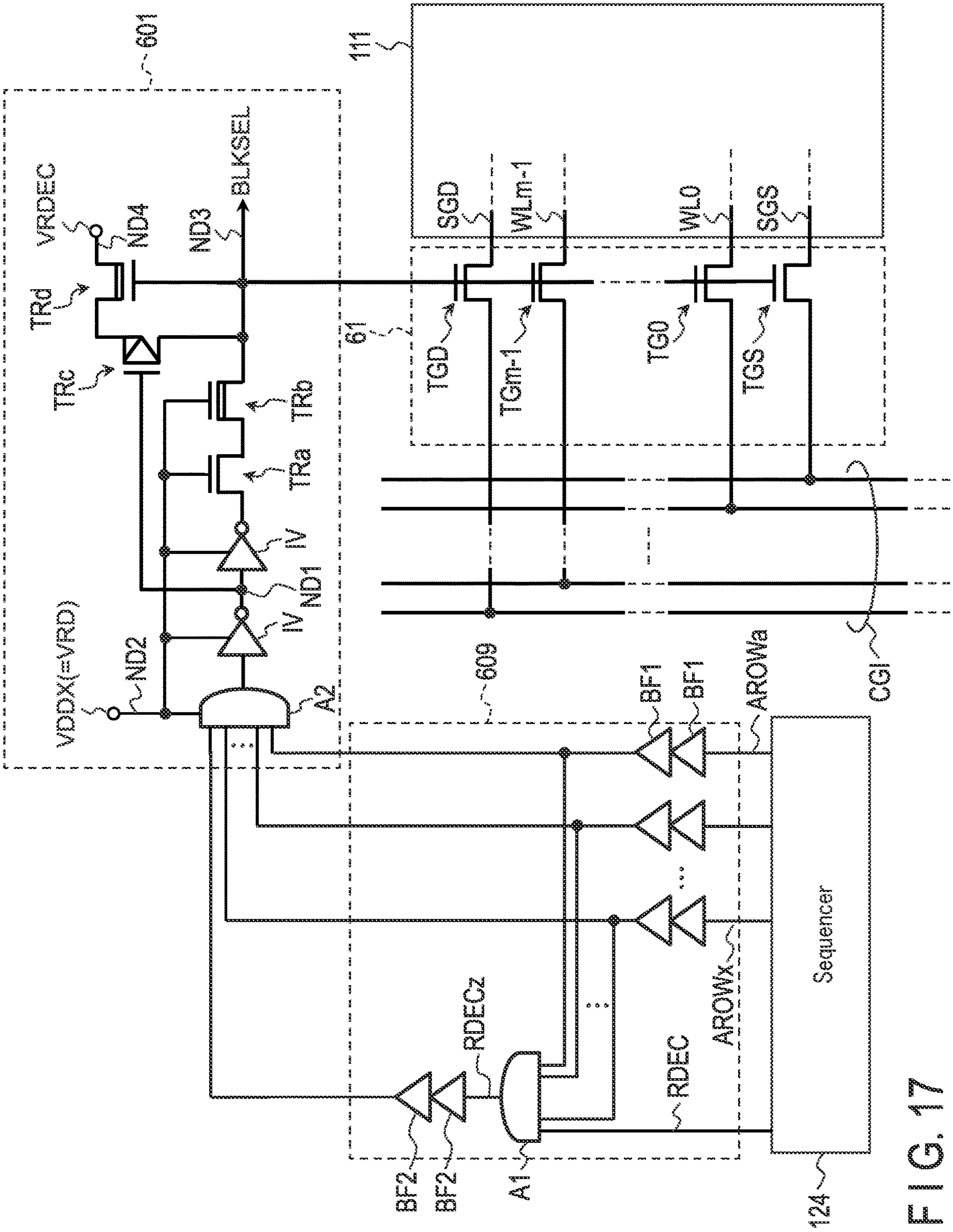
F I G. 17

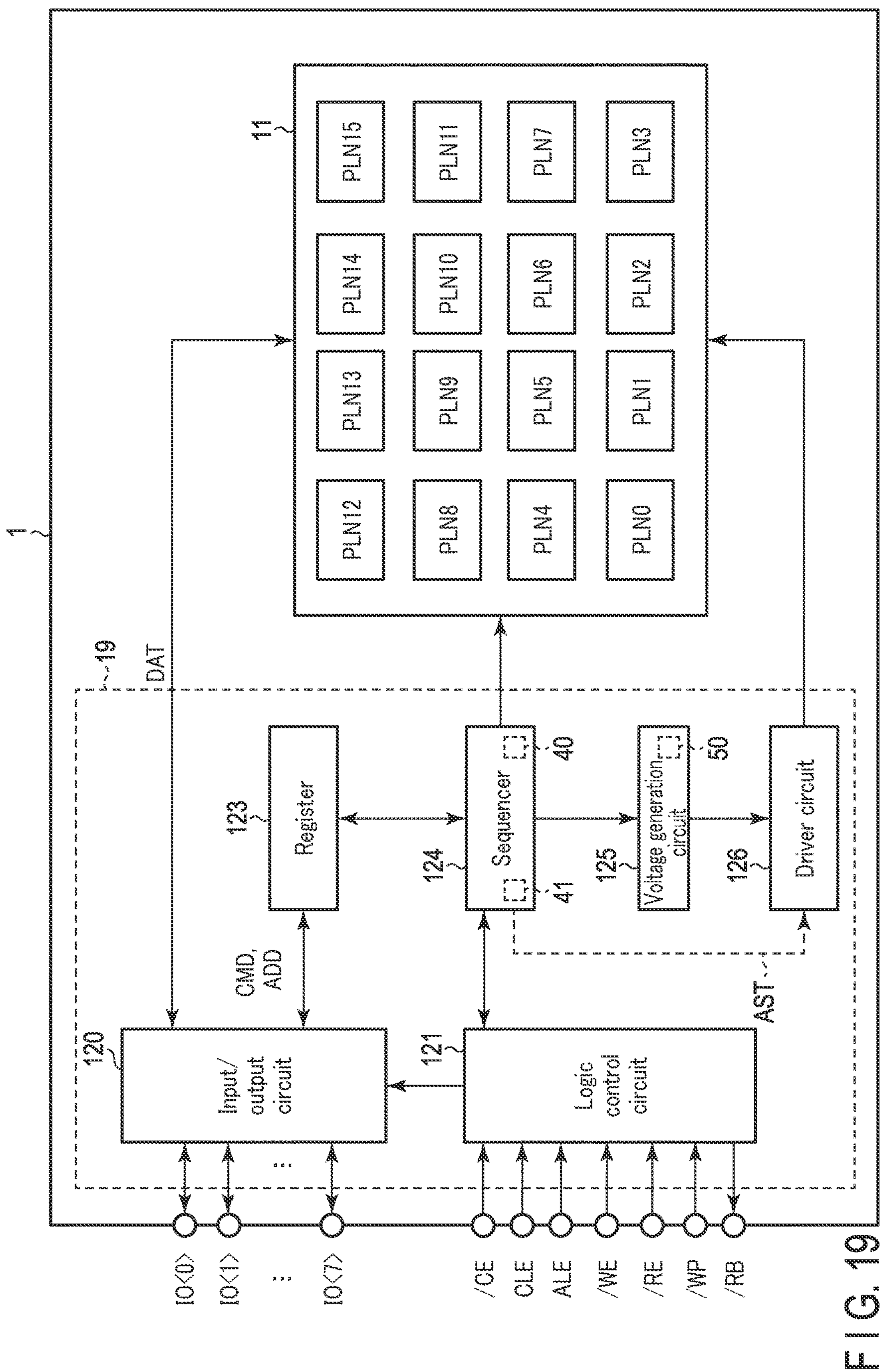
F I G. 19

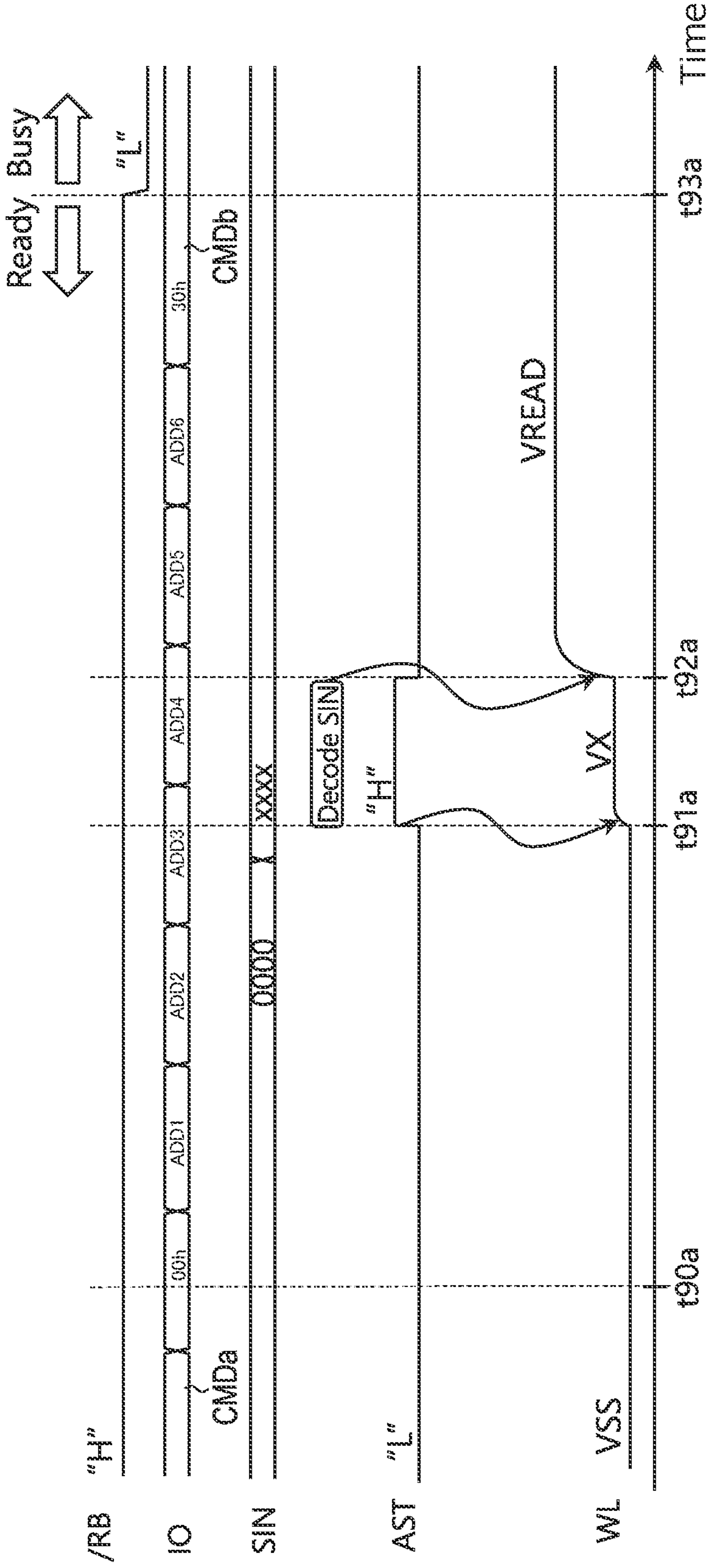
F I G. 20

MEMORY DEVICE WHICH GENERATES OPERATION VOLTAGES IN PARALLEL WITH RECEPTION OF AN ADDRESS

CROSS-REFERENCE TO RELATED APPLICATIONS

This application is a Continuation application of U.S. application Ser. No. 17/570,676, filed on Jan. 7, 2022, which is a Continuation application of U.S. application Ser. No. 17/168,822, filed on Feb. 5, 2021, and issued as U.S. Pat. No. 11,257,551 on Feb. 22, 2022, which is a Continuation application of U.S. application Ser. No. 16/567,982, filed on Sep. 11, 2019, and issued as U.S. Pat. No. 10,957,404 on Mar. 23, 2021, which is based upon and claims the benefit of priority from Japanese Patent Application No. 2018-241544, filed on Dec. 25, 2018, the entire contents of all of which are incorporated herein by reference.

FIELD

Embodiments described herein relate generally to a memory device.

BACKGROUND

In memory devices, such as NAND flash memories, improvement in properties is promoted. Such improvement in properties includes, for example, increase in speed of operation and increase in reliability.

BRIEF DESCRIPTION OF THE DRAWINGS

FIG. 3 is a diagram illustrating a configuration example of the memory device according to the first embodiment;

FIG. 4 is a diagram illustrating a configuration example of the memory device according to the first embodiment;

FIG. 5 is a diagram illustrating a configuration example of the memory device according to the first embodiment;

FIG. 7, FIG. 8, FIG. 9, FIG. 10, FIG. 11, FIG. 12, FIG. 13, FIG. 14, and FIG. 15 are diagrams illustrating an operation example of the memory device according to the first embodiment;

FIG. 16 and FIG. 17 are diagrams illustrating a configuration example of a memory device according to a second embodiment;

FIG. 19 is a diagram illustrating a configuration example of a memory device according to a third embodiment; and FIG. 20 and FIG. 21 are diagrams illustrating an operation example of the memory device according to the third embodiment.

DETAILED DESCRIPTION

Figure 1:
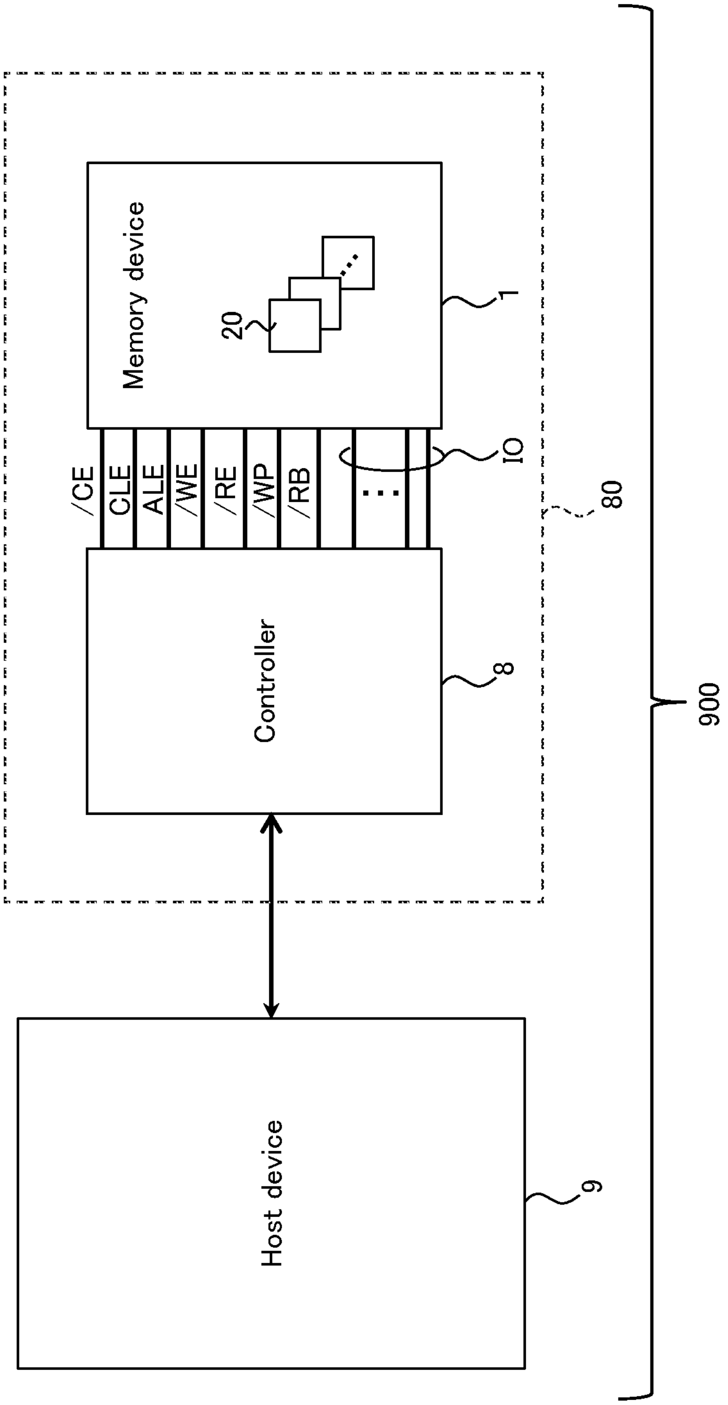
FIG. 1 is a diagram illustrating an example of a memory system according to an embodiment.

Memory devices according to embodiments will be described hereinafter with reference to FIG. 1 to FIG. 21.

The present embodiments will be described in detail hereinafter with reference to drawings. In the following explanation, constituent elements having the same functions and structures will be denoted by the same reference numerals.

In the following embodiments, when it is unnecessary to mutually distinguish constituent elements with reference numerals (such as word lines WL and/or bit lines BL, and various voltages and/or signals) provided with numbers/alphabets at the end for distinction, description (reference numerals) are used with the numbers/alphabets at the end omitted.

In general, according to one embodiment, a memory device includes: memory cell array; a voltage generation circuit generating one or more voltages supplied to the memory cell array; an input/output circuit receiving an address indicating a region in the memory cell array; and a control circuit controlling operations of the memory cell array. The voltage generation circuit generates the voltages during reception of the address.

(1) First Embodiment

The following is an explanation of a memory device, a memory system, and a method for controlling the memory device (or the memory system) with reference to FIG. 1 to FIG. 15.

(a) Configuration Example

The following is an explanation of a memory device and a memory system according to the first embodiment with reference to FIG. 1 to FIG. 7.

(a1) Memory System

The following is an explanation of a system including a memory device according to the present embodiment with reference to FIG. 1.

FIG. 1 is a block diagram of a system including a memory device according to the embodiment.

As illustrated in FIG. 1, a system (for example, a memory system) 900 includes a host device 9, a controller 8, and a memory device 1.

The host device 9 is electrically connected to the controller 8 through wireless communication or wired communication. In this manner, the host device 9 is enabled to communicate with the controller 8. The host device 9 requests the controller 8 to perform various operations, such as write/erase of data to/from the memory device 1, and read of data from the memory device 1.

The controller 8 generates and issues a command CMD on the basis of a request from the host device 9. In reading of data, the controller 8 transmits a read command CMD and an address (hereinafter referred to as "select address") ADD of an operation target to the memory device 1 through an interconnect IO. In writing of data, the controller 8 transmits a write command CMD, an address ADD of an operation target, and data DT to be written to the memory device 1 as a signal IO. The controller 8 transmits various control signals CNT to the memory device 1.

The memory device 1 according to the present embodiment is electrically connected to the controller 8 through an interconnect and a terminal (pad, connector, or pin).

The memory device 1 according to the present embodiment is, for example, a NAND flash memory.

For example, the NAND flash memory 1 includes a plurality of chips 20. Each of the chips 20 includes a plurality of memory cells (not illustrated). Each of the memory cells stores data in a substantially non-volatile manner.

For example, the NAND flash memory 1 and the controller 8 form a storage device 80. Examples of the storage device 80 include a SSD (solid state drive), a memory card, or a USB memory.

(a2) Flash Memory

Figure 2:
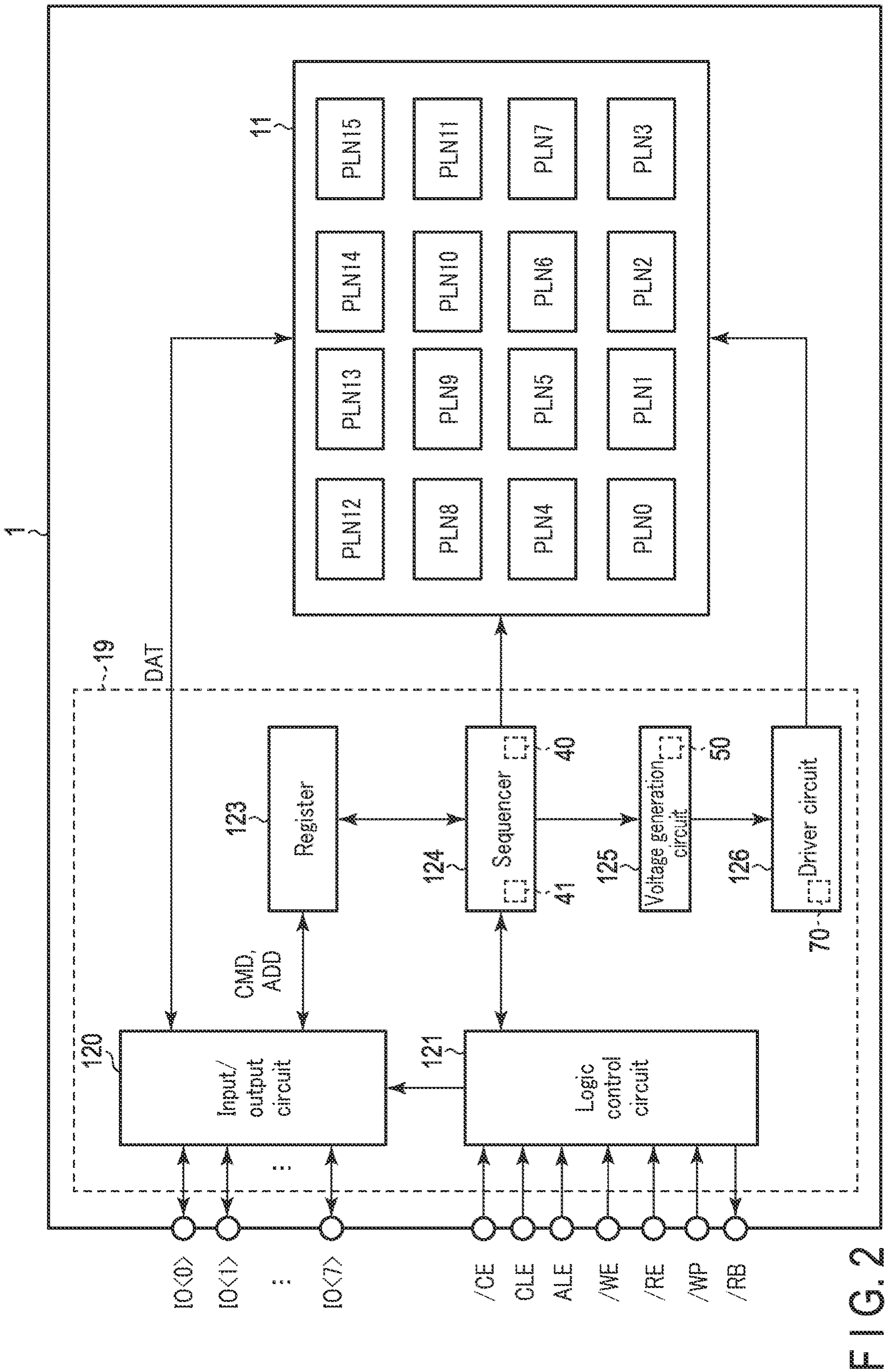
FIG. 2 is a diagram illustrating a configuration example of a memory device according to a first embodiment.

FIG. 2 is a block diagram for explaining an internal configuration of the NAND flash memory according to the present embodiment.

As illustrated in FIG. 2, the NAND flash memory 1 includes a core circuit 11 and a peripheral circuit 12. The core circuit 11 includes a plurality of planes PLN (PNL0, PLN1, . . . , PLN15). Each of the planes PLN includes a memory cell array. Each memory cell array includes a plurality of blocks. Each of the blocks includes a plurality of memory cells (not illustrated).

Each of the planes PLN performs predetermined operations on each of blocks (not illustrated) as a unit. For example, each of the planes PLN performs a data write operation and/or a data read operation on a part of memory cells in a block. Each of the planes PLN performs a data erase operation on all the memory cells in a block or part of memory cells in a block. The planes PLN0 to PLN15 are capable of operating independently of one another, and capable of operating simultaneously (in parallel). The planes PLN0 to PLN 15 have the same structure.

The peripheral circuit 12 includes an input/output circuit 120, a logic control circuit 121, a register circuit 123, a sequencer 124, a voltage generation circuit 125, and a driver circuit 126.

The input/output circuit 120 transmits and receives signals IO (IO <7:0>) to and from the controller 8. The input/output circuit 120 transfers a command CMD and an address ADD in the signals IO to the register circuit 123. The input/output circuit 120 transmits and receives write data and read data (data DAT) to and from the core circuit 11.

The logic control circuit 121 receives signals/CE, CLE, ALE, /WE, /RE, and/WP from the controller 8. The logic control circuit 121 transmits a signal/RB to the controller 8. The logic control circuit 121 transmits a signal/RB to the controller 8. With the signal/RB, the state of the NAND flash memory 1 is notified to the controller 8.

A chip enable signal/CE is a signal to enable the flash memory 1. A command latch enable signal CLE is a signal indicating that the signal IO is a command. An address latch enable signal ALE is a signal indicating that the signal IO is an address. A write enable signal/WE is a signal to take the received signal into the flash memory 1. A read enable signal/RE is a signal to read data from the flash memory 1 with the controller 8. In this manner, the flash memory 1 outputs the signal IO to the controller 8 on the basis of the toggled read enable signal/RE. A write protect signal/WP instructs the NAND flash memory 10 to prevent data write and data erase.

A ready/busy signal/RB indicates whether the NAND flash memory 1 is in a ready state (state of receiving a command from outside) or a busy state (state of receiving no command from outside).

The signals IO are, for example, a set of 8-bit signals (IO <7:0>). The signals IO are actual substance of data transmitted and received between the NAND flash memory 1 and the controller 8. The signals IO includes a command CMD, an address ADD, and data DAT. The data DAT includes write data and read data.

The register circuit 123 retains a command CMD and an address ADD. The register circuit 123 transfers, for example, the address ADD and the command CMD to the sequencer 124.

The sequencer 124 receives a command set including a command CMD and an address ADD. The sequencer 124 controls the whole NAND flash memory 1 in accordance with the sequence based on the received command set. For example, the sequencer 124 is capable of causing each of the planes to execute a data read operation, a write operation, or an erase operation by synchronizing the planes PLN in the core circuit 11 with an output of the control signal.

For example, the sequencer 124 includes a decode circuit 40 and a temperature sensor 41, and the like. The decode circuit 40 decodes a command CMD and an address ADD. The temperature sensor 41 is capable of measuring the temperature of the chips 20 of the NAND flash memory 1.

The voltage generation circuit 125 generates a plurality of voltages used for a data write operation, a data read operation, and a data erase operation, and the like, on the basis of an instruction from the sequencer 124. The voltage generation circuit 125 supplies the generated voltages to the driver circuit 126.

The driver circuit 126 supplies various voltages from the voltage generation circuit 125 to the core circuit 11. The driver circuit 126 includes a plurality of drivers 70. Each of the drivers 70 outputs corresponding one of the voltages.

(a3) Plane

The following is an explanation of a configuration example of the planes of the NAND flash memory 1 according to the present embodiment with reference to FIG. 3. The example of FIG. 3 illustrates a configuration example of the plane PLN0. The other planes PLN have substantially the same structure as the structure of FIG. 3.

FIG. 3 is a diagram illustrating an example of an internal configuration of the plane of the NAND flash memory.

As illustrated in FIG. 3, the plane PLN0 at least includes a memory cell array 111, a row decoder 112, and a sense amplifier module 113.

The memory cell array 111 includes a plurality of blocks BLK (BLK0, BLK1, . . . ). The blocks BLK are mutually distinguished with, for example, mutually distinguishable block addresses. Each of the planes PLN other than the plane PLN0 also includes blocks BLK corresponding to the same block addresses as those of the plane PLN0. Blocks BLK provided with the same block address between the different planes PLN are mutually distinguished with mutually distinguishable plane addresses. Each of the blocks BLK includes a plurality of memory cells (not illustrated) associated with word lines and bit lines. The block BLK serves as, for example, the data erase unit. Data in the same block BLK is erased all together.

However, data can be erased in units smaller than blocks. A method for erasing data is disclosed in, for example, U.S. patent application Ser. No. 13/235,389 "NONVOLATILE SEMICONDUCTOR MEMORY DEVICE" filed on Sep. 18, 2011. Another method for erasing data is disclosed in U.S. patent application Ser. No. 12/694,690 "NON-VOLATILE SEMICONDUCTOR STORAGE DEVICE" filed on Jan. 27, 2010. In addition, another method for erasing data is disclosed in U.S. patent application Ser. No. 13/483,610 "NONVOLATILE SEMICONDUCTOR MEMORY DEVICE AD DATA ERASE METHOD THEREOF" filed on May 30, 2012. The whole of these patent applications are cited by reference in the specification of the present application.

Each of the blocks BLK includes a plurality of string units SU (SU0, SU1, . . . ). Each of the string units SU includes a plurality of NAND strings NS. The number of blocks in one memory cell array 111, the number of string units in one block BLK, and the number of NAND strings NS in one string unit SU may be set to any numbers.

The row decoder 112 receives a row address of the address ADD from the register circuit 123. The row decoder 112 selects the block BLK, the string unit SU, and the word line (not illustrated), on the basis of the row address. The voltage from the driver circuit 126 is transferred to the selected block BLK through the row decoder 112.

The sense amplifier module 113 receives a column address of the address ADD from the register circuit 123. The sense amplifier module 113 executes an operation instructed with the sequencer 124 on the operation target indicated in the address ADD. When data is read, the sense amplifier module 113 senses presence/absence (or change in potential of the bit line) of occurrence of the current corresponding to turning on/off of the memory cells in the bit line (not illustrated). In this manner, the sense amplifier module 113 reads data. When data is written, the sense amplifier module 113 transfers data (write data) to be written to the memory cell through the bit data to the memory cell.

(a4) Memory Cell Array

The following is an explanation of an internal configuration of the memory cell array in the NAND flash memory according to the present embodiment with reference to FIG. 4 and FIG. 5.

FIG. 4 is a diagram illustrating a circuit configuration of the memory cell array 111 in the plane PLN0. FIG. 4 illustrates a circuit diagram of a block. The other planes PLN have a memory cell array of substantially the same configuration as the circuit configuration of FIG. 4.

As illustrated in FIG. 4, each of the string units SU is a group of NAND strings NS. Each of the NAND strings NS includes a plurality of memory cells MC, a select transistor ST1, and a select transistor ST2.

The number of memory cells MC in a NAND string NS is 8, 16, 32, 64, 96, or 128, or the like. The number of memory cells MC in a NAND string NS is not limited.

Each of the memory cells MC includes a stacked gate including a control gate and a charge storage layer. The memory cells MC are connected in series between the select transistors ST1 and ST2.

Select gate lines SGD0 to SGD3 are connected to respective gates of select transistors ST1 of the corresponding string units SU0 to SU3 in a block BLK. Each of the select gate lines SGD is connected to one string unit SU in a plurality of string units SU in the same block BLK.

A select gate line SGS is connected in common with gates of select transistors ST2 of all the string units SU in a block BLK. The select gate line SGS is connected in common with all the string units SU in the same block BLK. A plurality of word lines WL0 to WLm−1 are connected to respective control gates of corresponding memory cells MC0 to MCm−1 in the same block BLK. The word line WL of the same address is connected in common with all the string units SU in the same block BLK.

In NAND strings NS arranged in a matrix manner in the memory cell array 111, terminals of the select transistors ST1 of the NAND strings NS in the same column are connected to corresponding one of n bit lines BL (BL0 to BLn−1). Each of the bit lines BL is connected to a plurality of NAND strings NS of the same column (same address) through a plurality of blocks BLK.

Terminal of the select transistor ST2 is connected to a source line SL. The source line SL is connected to a plurality of NAND strings NS through a plurality of blocks BLK.

Read and write of data can be performed all together on a plurality of memory cells MC connected in common with one of word lines WL in any string unit SU of any block BLK. A group of memory cells MC sharing a word line WL in one string unit SU as described above is called, for example, "cell unit". The cell unit is a group of memory cells MC on which a write operation or a read operation can be executed all together.

As described above, erase of data is performed all together on, for example, memory cells MC in the same block BLK.

One memory cell MC is capable of storing, for example, data of one or a plurality of bits. The following explanation illustrates the case where one memory cell MC can store one-bit data, to simplify the explanation. In the same cell unit, a set of 1-bit data stored in the respective memory cells MC in the bits of the same place (digit) are referred to as "page". The term "page" can be defined as part of a memory space formed in the group of memory cells MC in the same cell unit.

The following is an explanation of a cross-sectional structure of the memory cell array of the flash memory according to the present embodiment. FIG. 5 illustrates a cross-sectional view of part of the memory cell array.

FIG. 5 schematically illustrates a part relating to two string units SU in one block BLK. FIG. 5 illustrates respective NAND strings NS of the two string units SU and a peripheral part thereof.

A plurality of structures illustrated in FIG. 5 are arranged in the X direction. For example, a set of a plurality of NAND strings NS illustrated in FIG. 5 and arranged in the X direction correspond to a string unit SU.

The memory cell array 111 is provided on a semiconductor substrate 30. In the following explanation, a X-Y plane is a plane parallel with a surface of the semiconductor substrate 30. A Z direction is a direction perpendicular to the X-Y plane. In the present embodiment, the X direction and the Y direction are mutually orthogonal.

A p-type well region 30*p* is provided in an upper portion (surface region) of the semiconductor substrate 30. A plurality of NAND strings NS are provided on the p-type well region 30*p*.

On the p-type well region 30*p*, for example, a conductive layer 31 functioning as a select gate line SGS, a plurality of conductive layers 32 functioning as the word lines WL0 to WLm−1, and a conductive layer 33 functioning as a select gate line SGD are successively stacked from the semiconductor substrate side. A plurality of conductive layers 31 and a plurality of conductive layers 33 may be stacked on the semiconductor substrate 30. Insulating layers (not illustrated) are provided respectively between layers of the stacked conductive layers 31 to 33. As described above, a stacked structure including a plurality of conductive layers 31 to 33 and a plurality of insulating layers is formed on the semiconductor substrate 30.

The conductive layer 31 is connected in common with gates of respective select transistors ST2 of a plurality of NAND strings NS in one block BLK. The conductive layers 32 are connected in common with control gates of respective memory cells MC of a plurality of NAND strings NS in one block BLK, for respective layers (interconnection levels). The conductive layer 33 is connected in common with gates of respective select transistors ST1 of a plurality of NAND strings NS in one block BLK.

Memory holes MH are provided to pierce the conductive layers 33, 32, and 31 and reach the p-type well region 30*p*. A block insulating layer 34, a charge storage layer (insulating film) 35, and a gate insulating layer (tunnel insulation layer) 36 are successively provided on side surfaces of each of the memory holes MH. A semiconductor pillar (conductive layer) 37 is embedded into each memory hole MH. The semiconductor pillar 37 is, for example, non-doped polysilicon. The semiconductor pillar 37 functions as a current path of the NAND string NS (memory cells MC). A conductive layer 38*a* functioning as a bit line BL is provided above the semiconductor pillars 37. Each of the semiconductor pillars 37 is connected to the conductive layer 38*a* through a contact plug VP.

A n+ type impurity diffusion layer 39*n* and a p+ type impurity diffusion layer 39*p* are provided in the upper part (surface region of the semiconductor substrate 30) of the p-type well region 30*p*. A contact plug CPa is provided on an upper surface of the n+ type impurity diffusion layer 39*n*. A conductive layer (interconnect) 38*b* functioning as a source line SL is provided on an upper surface of the contact plug CPa. A contact plug CPb is provided on an upper surface of the p+ type impurity diffusion layer 39*p*. A conductive layer 38*c* functioning as a well line CPWELL is provided on an upper surface of the contact plug CPb.

As described above, a select transistor ST2, a plurality of memory cells MC, and a select transistor ST1 are stacked on the p-type well region 30*p* in order from the semiconductor substrate side. A memory hole MH (or a semiconductor pillar) corresponds to a NAND string NS.

The configuration of the memory cell array 111 (block BLK) is not limited to the configurations of FIG. 4 and FIG. 5. A configuration of a memory cell array 111 is disclosed in, for example, U.S. patent application Ser. No. 12/407,403 "THREE DIMENSIONAL STACKED NONVOLATILE SEMICONDUCTOR MEMORY" filed on Mar. 19, 2009. A configuration of a memory cell array 18 is disclosed in U.S. patent application Ser. No. 12/406,524 "THREE DIMENSIONAL STACKED NONVOLATILE SEMICONDUCTOR MEMORY" filed on Mar. 18, 2009, U.S. patent application Ser. No. 12/679,991 "NON-VOLATILE SEMICONDUCTOR STORAGE DEVICE AND METHOD OF MANUFACTURING THE SAME" filed on Mar. 25, 2010, and U.S. patent application Ser. No. 12/532,030 "SEMICONDUCTOR MEMORY AND METHOD FOR MANUFACTURING SAME" filed on Mar. 23, 2009. The whole of these patent applications are cited by reference in the specification of the present application.

A chip including a layer (first layer) provided with the memory cell array 111 may be formed separately from a chip including a layer (second layer) provided with the row decoder 112 and/or the sense amplifier module 113. In this case, the chip including the memory cell array 111 is bonded with the chip including the row decoder 112 and/or the sense amplifier module 113, and a pair of the bonded chips is used as the NAND flash memory 1 in the embodiment described above. In the bonded-type NAND flash memory 1, supposing that the upper side is a side provided with the conductive layer 38 functioning as the bit line BL in the region provided with the memory cell array 111 and the lower side is a side provided with the semiconductor substrate 30, the lower chip is provided with the layer provided with the row decoder 112 and/or the sense amplifier module 113.

In the NAND flash memory 1 according to the present embodiment, the layer provided with the row decoder 112 and/or the sense amplifier module 113 may be provided on the semiconductor substrate in the lower side of the memory cell array 111. In this case, the memory cell array 111 is provided on the layer provided with the row decoder 112 and/or the sense amplifier module 113 in the Z direction. The memory cell array 111 is disposed on an interlayer insulating film covering the layer provided with the row decoder 112 and/or the sense amplifier module 113.

(a5) Command Set

Figure 6:
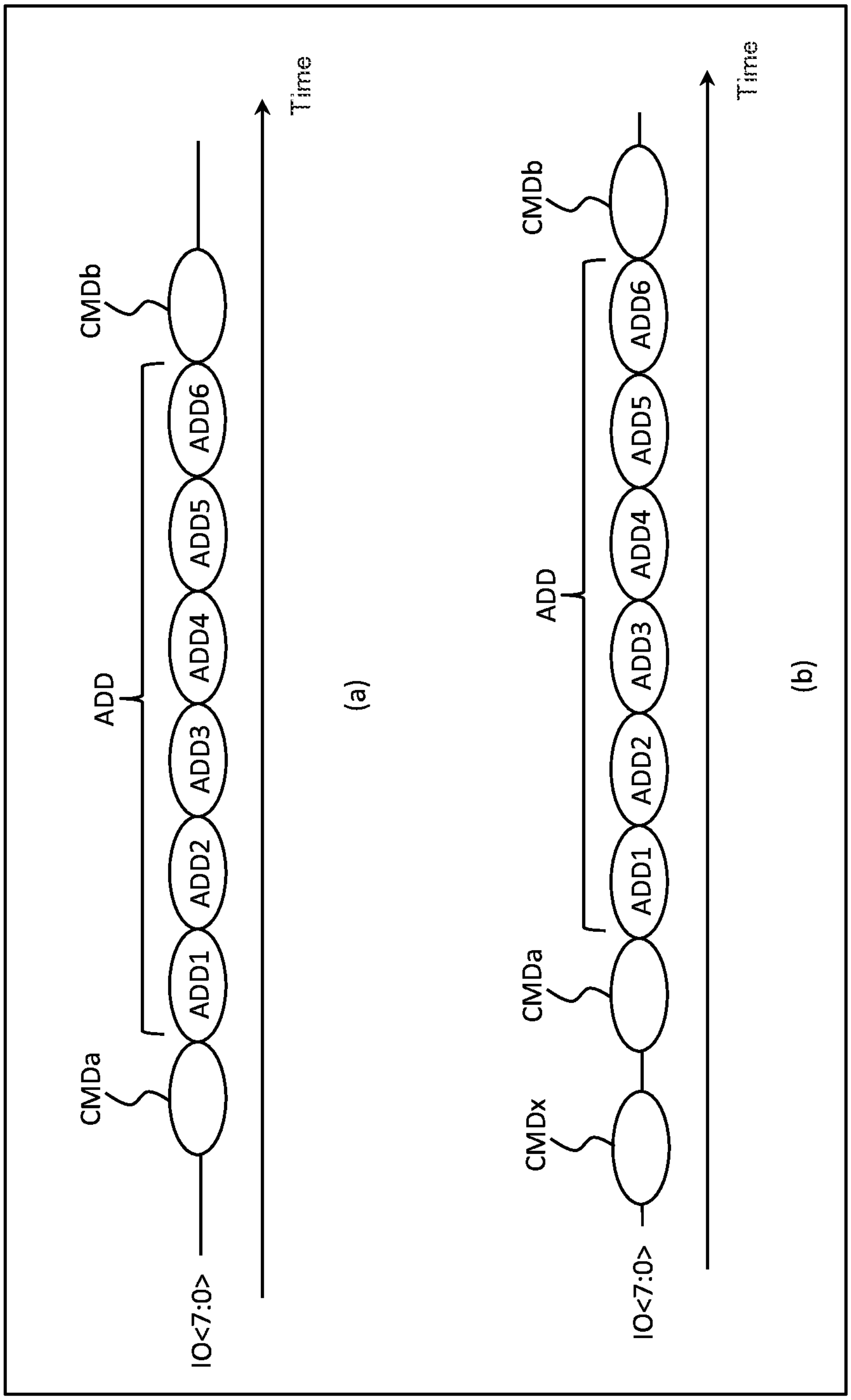
FIG. 6 is a diagram illustrating a configuration example of the memory device according to the first embodiment.

The following is an explanation of a command set of the memory system and the flash memory according to the present embodiment with reference to FIG. 6 and FIG. 7. FIG. 6 is a diagram schematically illustrating a configuration example of a command set.

(a) of FIG. 6 is a diagram illustrating an example of a command set of a NAND flash memory.

As illustrated in (a) of FIG. 6, in a memory system including a NAND flash memory, a command set includes commands CMDa and CMDb, and an address ADD.

In a transfer sequence (hereinafter referred to as "command sequence") of a command set, the command set is transmitted from the controller 8 to the flash memory 1 in the order of the first command CMDa, the address ADD, and the second command CMDb. The commands CMD (CMDa and CMDb) and the address ADD are transmitted from the controller 8 to the flash memory 1 in the units of eight bits.

A command CMD is a signal to instruct the flash memory to perform a certain operation.

The command CMDa is transmitted from the controller 8 to the flash memory 1 through the data line before transmission of the address ADD. The command CMDa is a command transmitted before input of an address of the target of a certain operation. The command CMDb is transmitted from the controller 8 to the flash memory 1 through the data line after transmission of the address ADD. The command CMDb is a command to instruct an execution of the certain operation on the input address.

The address ADD is a signal indicating the region serving as the target of an operation performed with the command CMD. The address ADD is transmitted from the controller 8 to the flash memory 1 through the data line, after transmission of the command CMDa and before transmission of the command CMDb. The address ADD is transmitted over five cycles or six cycles.

(b) of FIG. 6 illustrates a diagram illustrating a modification of the command set.

As illustrated in (b) of FIG. 6, the command set may include an additional command. The additional command (also referred to as "prefix command" or "function command" hereinafter) is transmitted from the controller 8 to the flash memory 1 through the data line, before transmission of the command CMDa.

The additional command is a command to additionally announce (instruction) setting of conditions and specific processing and the like for the operation to be executed with the subsequent command.

FIG. 7 is a diagram illustrating an example of address transfer cycles in the command set.

Data of eight bits of the first cycle indicate part of the column address. In data of eight bits of the second cycle, data of five bits indicate the remaining part of the column address, and data of three bits indicate the value of "Don't Care". In data of eight bits of the third cycle, data of two bits indicate the address of the string unit SU, and the remaining data of six bits indicate part of the address of the word line WL. In data of eight bits of the fourth cycle, data of one bit indicates the remaining part of the address of the word line WL, data of four bits indicate the address of the plane PLN, and data of three bits indicate part of address of the block BLK. In data DT of eight bits of the fifth cycle, data of seven bits indicate the remaining part of the address of the block BLK.

For example, when the NAND flash memory 1 includes a plurality of memory chips, the address of the memory chip is transmitted from the controller 8 to the flash memory 1 using part of the data of the fifth cycle and the data IO of the sixth cycle. For example, in data IO of eight bits of the fifth cycle, the remaining one bit indicates part of the address of the chip. In data IO of eight bits of the sixth cycle, data of two bits indicate the remaining part of the address of the chip. In data IO of eight bits of the sixth cycle, data of the remaining six bits is data of "Don't Care".

As described above, in the memory system including a NAND flash memory, a memory space in the memory cell array is selected on the basis of a command set (command sequence), and an operation on the selected memory space is performed.

(b) Operation

The following is an explanation of the memory device (such as NAND flash memory) and the memory system according to the present embodiment with reference to FIG. 8 to FIG. 15.

(b1) Basic Example

The following is an explanation of a basic example of operations (control method) of the flash memory and the memory system according to the present embodiment.

Figure 8:
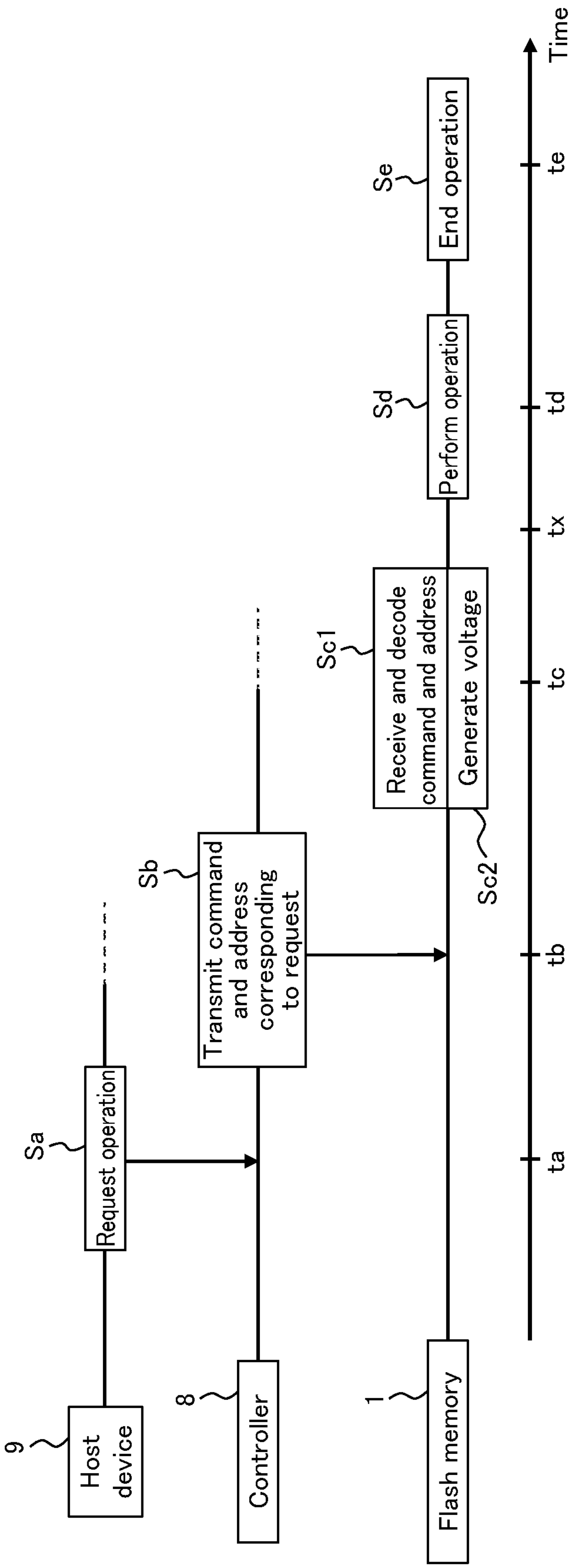

FIG. 8 is a schematic diagram for explaining a basic example of operations of the memory system and the memory device (flash memory) according to the present embodiment.

As illustrated in FIG. 8, the host device 9 requests the controller 8 to performs a certain operation on the flash memory 1 at certain time to (Step Sa).

The controller 8 sets a command corresponding to the operation and an address of an operation target, to deal with the request of the host device 9. At time tb, the controller 8 transmits the command and the address to the flash memory 1 (Step Sb).

The flash memory 1 receives the command and the address at time tc (Step Sc1). The flash memory 1 decodes the received command and the address.

In the present embodiment, the flash memory 1 starts and executes generation of voltages used for the operation of the memory cell array (memory cell), in parallel with decoding of the command and/or decoding of the address (Step Sc2). For this reason, the voltage used for the operation to be performed is generated during the period of decoding the command and/or decoding the address. The interconnect between the memory cell array 111 and the driver circuit 126 and the interconnects (word lines, bit lines, and select gate lines) in the memory cell array 111 are charged during the period of decoding the command and/or decoding the address.

After decoding the command and the address, at time td, the flash memory 1 performs the operation corresponding to the command on a memory space (one or more memory cells) corresponding to the address using the generated voltage (Step Sd).

For example, when the operation to be performed is a write operation, the flash memory 1 writes data received together with the command and the address to a memory space (for example, one or more page) indicated with the address in the memory cell array 111. For example, when the operation to be performed is a read operation, the flash memory 1 reads data from the memory space indicated with the address. The flash memory 1 transmits the read data to the controller 8. The controller 8 transmits the data to the host device 9. In addition, when the operation to be performed is an erase operation, the flash memory 1 erases data in the memory space indicated with the address in the memory cell array 111.

At time te, the flash memory 1 ends the operation to be performed (Step Se).

Ordinary flash memories start and execute generation of voltages after (for example, time tx) decoding of the command and the address. After generation of the voltage to be used for operation is completed, the operation corresponding to the command is performed.

By contrast, the flash memory 1 according to the present embodiment is capable of starting the operation to be performed earlier than in the case of generating voltages after decoding of the command/address. As a result, the flash memory 1 according to the present embodiment is enabled to shorten the period from reception of the command to start of the operation to be performed.

Accordingly, the memory system and the flash memory 1 according to the present embodiment enable increase in speed of operations.

(b2) Operation Example

Figure 9:
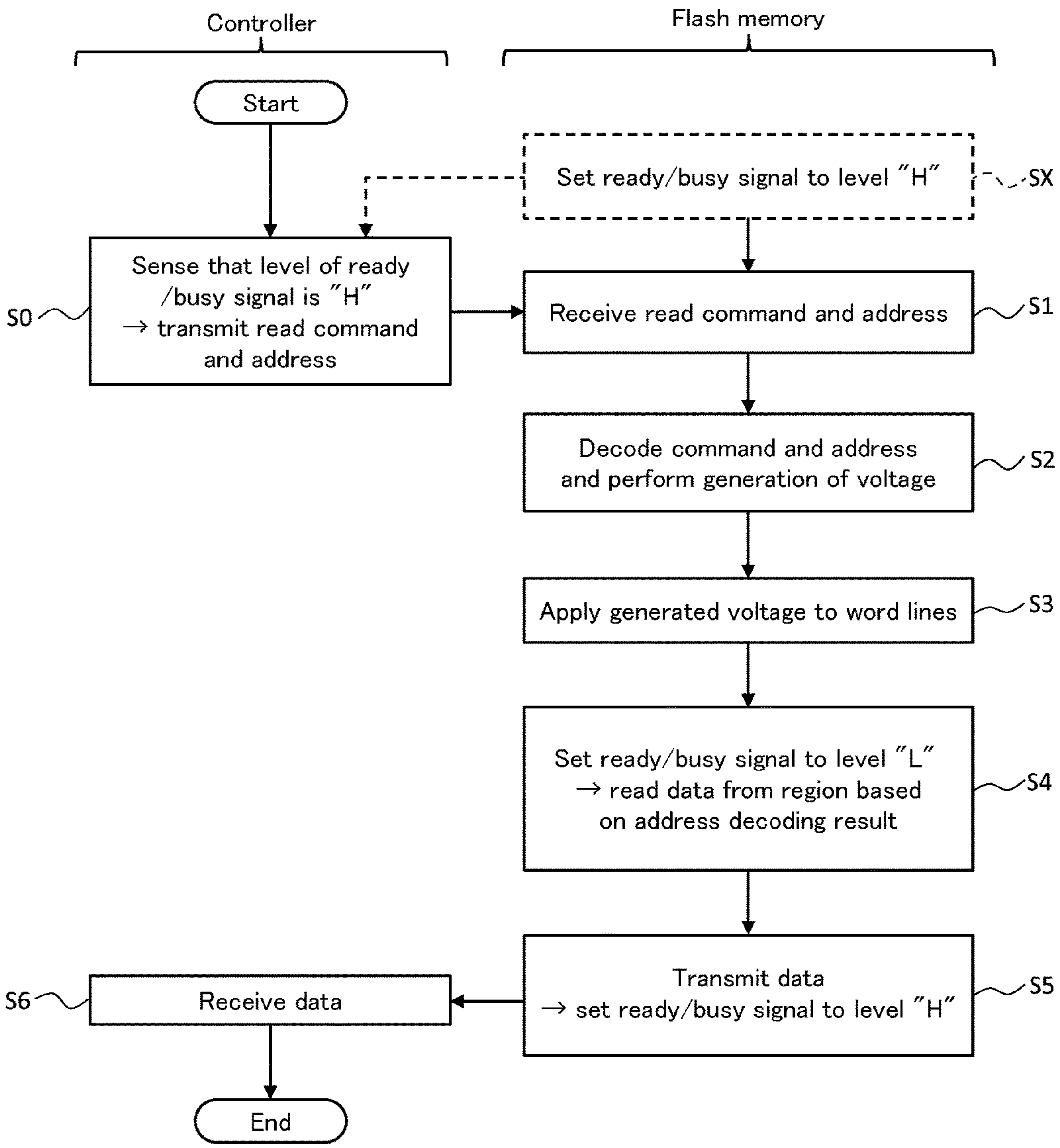
Figure 10:
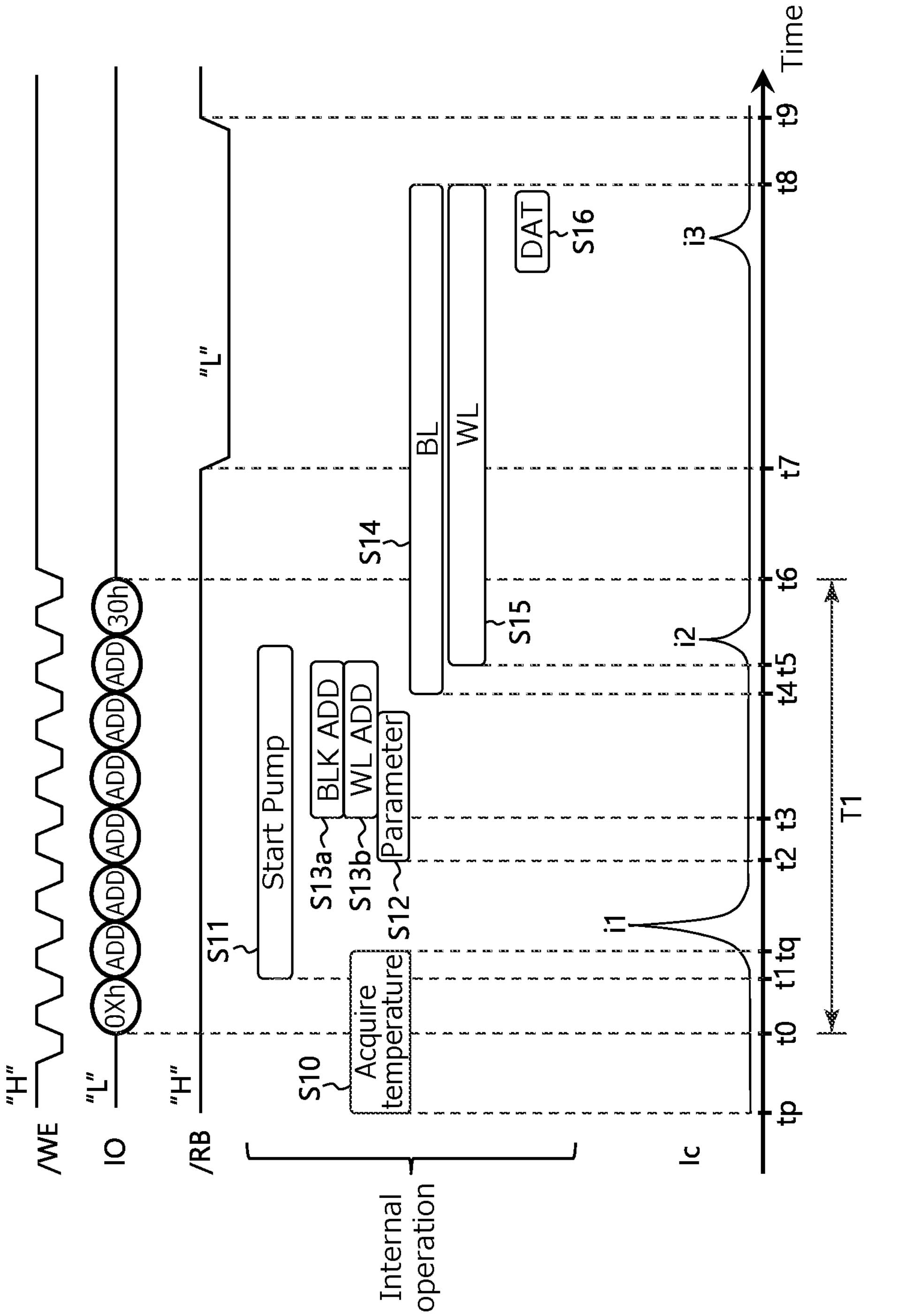

The following is an explanation of an operation example of the flash memory and the memory system according to the present embodiment with reference to FIG. 9 and FIG. 10.

FIG. 9 is a flowchart for explaining an operation example of the flash memory (and the memory system) according to the present embodiment. FIG. 10 is a timing chart for explaining an operation example of the flash memory (and the memory system) according to the present embodiment.

As illustrated in FIG. 9 and FIG. 10, the flash memory 1 sets a signal level of the ready/busy signal/RB to level "L" at a certain timing (for example, when an operation is completed) (Step SX in FIG. 9). The flash memory 1 is in the ready state.

The controller 8 checks the signal level of the ready/busy signal/RB. The controller 8 senses that the level of the ready/busy signal/RB is the level "H". On the basis of the ready/busy signal/RB with the level "H", the controller 8 sequentially transmits the command CMDa, the address ADD, and the command CMDb as the signal IO to the flash memory 1 on the basis of the command sequence of the NAND interface (Step S0). For example, the controller 8 transmits a command ("00h" and "30h") for data read to the flash memory 1 (Step S0 of FIG. 9).

At time t0, the flash memory 1 sequentially receives the command CMDa, the address ADD, and the command CMDb (Step S1). The flash memory 1 starts decoding of the command CMD and the address ADD. As described above, the address ADD is received with the flash memory 1 in the order of the column address and the row address. The command CMDa is a command "00h". The command CMDb is a command "30h". In this manner, the flash memory 1 recognizes that the operation to be performed is a read operation on a page (memory cells storing data of one bit).

For example, in the period from time tp to time tq (tp≤t0≤tq), the flash memory 1 acquires a temperature (temperature of the chip of the flash memory 1) inside the flash memory with a temperature sensor 41 (Step S10 in FIG. 10).

At time t1, the flash memory 1 performs generation of voltages, during the ready period (during the period in which the signal level of the signal/RB is "H") of the flash memory, in parallel with reception (and decoding) of the command CMD and the address ADD (Step S2 in FIG. 9). The voltage generation circuit 125 starts a charge pump 50 in synchronization with start of the toggle of the signal /WE. In this manner, generation of voltages used for the operation (such as a read operation) corresponding to the command is started (Step S11 in FIG. 10). With start of the charge pump 50, the current value of the current Ic of the flash memory 1 increases to approximately a certain value i1. For example, the current value i1 is a peak value of the current Ic in the operation corresponding to the command set.

At time t2, the sequencer 124 sets various operation parameters (such as the voltage value) of the operation to be performed (Step S12 in FIG. 10).

At time t3, the decode circuit 40 of the sequencer 124 starts decoding of the row address, in parallel with generation of the voltage and setting of parameters. In this manner, decoding (Step S13*a* of FIG. 10) of the word line address and decoding (Step S13*b* in FIG. 10) of the block address are performed. At time t4, the sense amplifier module 113 controls activation of the bit lines BL (Step S14 of FIG. 10), in parallel with decoding of the row address.

At time t5, decoding of the word line address and the block address is completed. In this manner, the sequencer 124 controls activation of the selected block, the selected string unit, and the selected word line, on the basis of the decoding result of the row address (Step S15 in FIG. 10). For example, the address information (hereinafter referred to as "word line address information") of the word line based on the decoding result is transferred from the sequencer 124 to each of the planes PLN by parallel transfer (for example, parallel transfer in eight bits). The word line address information may be transferred from the sequencer 124 to each of the planes PLN by serial transfer.

In this manner, the flash memory 1 applies the generated voltage to the word line in the ready period (Step S3 in FIG. 9). For example, at the timing of applying the voltage to the word line and the bit line, the current value of the current Ic has a certain value i2. The current value i2 is lower than the current value i1.

At time t6, reception of the command set (command CMDb) is completed.

For example, the command CMDb is decoded in parallel with activation of the selected word line WL.

After the period tWB has passed from reception of the command set, at time t7, the sequencer 124 changes the signal level of the ready/busy signal/RB from "H" to "L" (Step S4 in FIG. 9). In this manner, the flash memory 1 is set to the busy state. The flash memory 1 performs a read operation on the memory space (such as a page) corresponding to the address to deal with the command "0Xh" and the command "30h" (Step S16 in FIG. 10). For example, in the busy period, the current value of the current Ic has a value i3 at the timing of sensing (occurrence of a current) a current of the bit line. The current value i3 is equal to or lower than the current value i2.

At time t8, the NAND flash memory 1 inactivates the bit line BL and the word line WL. In this manner, the read operation of the flash memory 1 is ended.

The flash memory 1 transmits the read data to the controller 8 (Step S5 in FIG. 9).

Thereafter, at time t9, the sequencer 124 changes the signal level of the ready/busy signal/RB from level "L" to level "H". The flash memory 1 is set to the ready state.

The controller 8 receives the read data from the flash memory 1 (Step S6 in FIG. 9).

As described above, in the present embodiment, the NAND flash memory 1 operates the voltage generation circuit 125 during the period (and the decoding period) of receiving the command and the address.

In the flash memory according to the present embodiment, generation and/or application of the voltage is started during the setup operation of the row address (for example, the word line).

In this manner, the flash memory 1 according to the present embodiment generates voltages (for example, a read voltage and a non-selected voltage) used for the operation corresponding to the command, during the period Ti.

As a result, the flash memory 1 according to the present embodiment is enabled to shorten the period from reception of the command set to reading of data from the memory cell array.

(b1) Specific Example and Modification

The following is an explanation of a specific example and a modification of the operations of the NAND flash memory according to the present embodiment described above.

<Determination of Chip>

Figure 11:
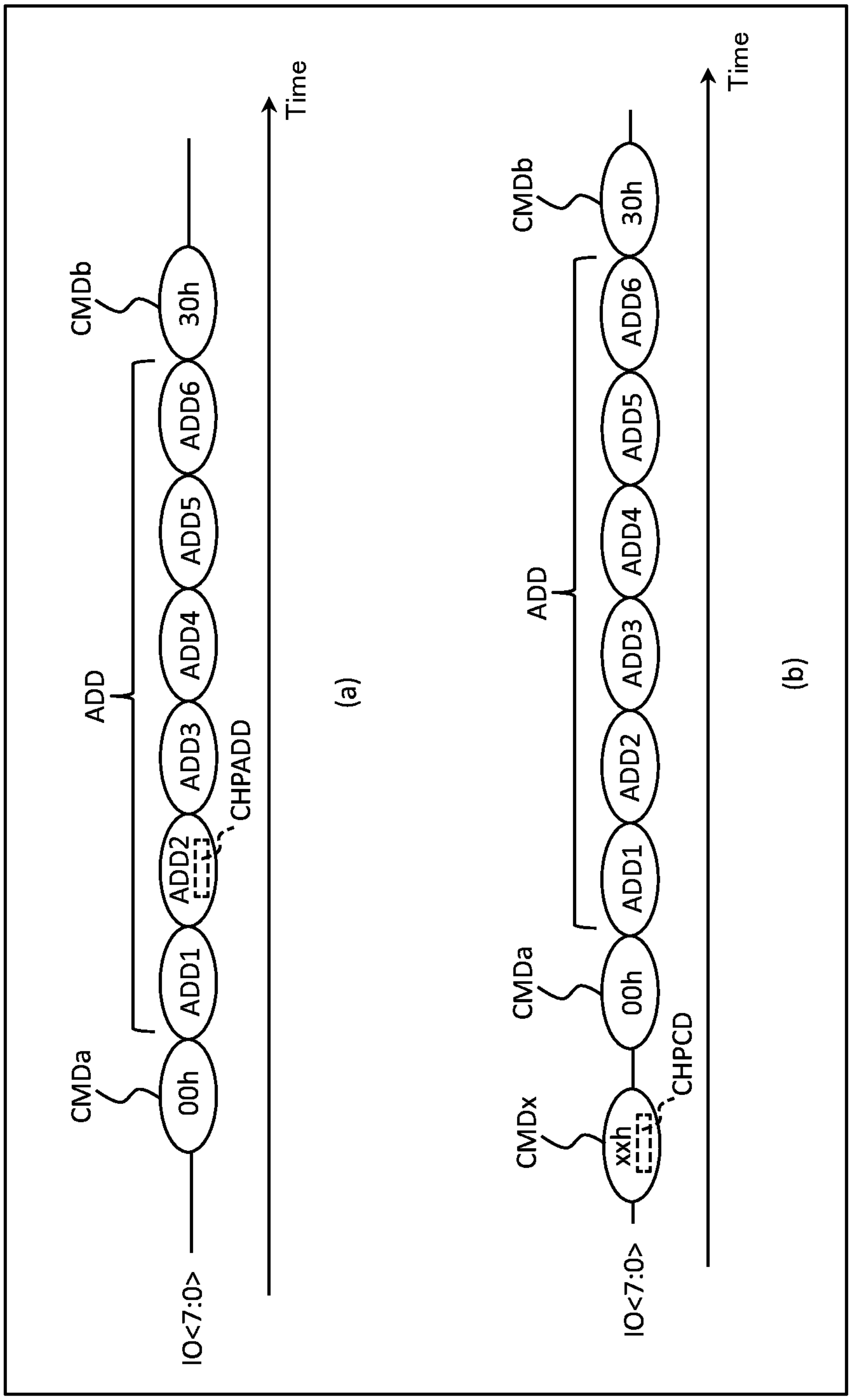

The following is an explanation of a specific example/modification of operations of the flash memory according to the present embodiment with reference to FIG. 11.

FIG. 11 is a diagram illustrating a specific example of the flash memory according to the present embodiment.

(a) of FIG. 11 illustrates a command set in a specific example of the flash memory according to the present embodiment.

For example, as illustrated in FIG. 7 described above, three bits of data "Don't care" exist in the data of the second cycle.

For this reason, as illustrated in (a) of FIG. 11, the chip address CHPADD can be included in data ADD2 of the second cycle of the address ADD.

As described above, in the case where the flash memory 1 includes a plurality of memory chips 20, the chip address CHPADD is notified to the flash memory 1 at the earlier stage than in the case where the chip address is transmitted in the cycle (such as data of the fifth cycle or the sixth cycle) after the second cycle.

The flash memory 1 according to the present embodiment is capable of recognizing the chip address CHPADD of the operation target at a relatively early stage of the command sequence. This structure enables the flash memory 1 according to the present embodiment to determinate the memory chip serving as the operation target, and set the memory chips other than the operation target to a non-selected state.

As a result, the flash memory 1 according to the present embodiment is capable of suppressing occurrence of a current (electric power) in the memory chips other than the operation target.

(b) of FIG. 11 illustrates an example different from the command set of (a) of FIG. 11.

As illustrated in (b) of FIG. 11, a code (for example, a identification number or a chip address) CHPCD indicating the memory chip serving as the operation target in the memory chips 20 may be notified from the controller 8 to the flash memory 1 by transmission of an additional command (prefix command) CMDx.

The prefix command CMDx is issued with the controller 8. The controller 8 transmits the issued prefix command CMDx to the NAND flash memory 1 at a timing (time) before the command CMDa.

By transmission and reception of the command set in the example of (b) of FIG. 11, the flash memory 1 according to the present embodiment is enabled to recognize which of the memory chips 20 serves as the operation target, before reception and decoding of the address ADD.

This structure enables the flash memory 1 to suppress occurrence of a current in the memory chips other than the memory chip serving as the operation target, in the memory system using the command set of the example in (b) of FIG. 11.

As described above, the flash memory 1 according to the present embodiment enables shortening (and reduction) of the period in which a current occurs in a plurality of non-selected memory chips. This structure enables the flash memory 1 according to the present embodiment to reduce the current occurring during preparation (such as during setup of the address) of the operation.

This structure consequently reduces power consumption in the flash memory 1 according to the present embodiment.

<Temperature Measurement>

Figure 12:
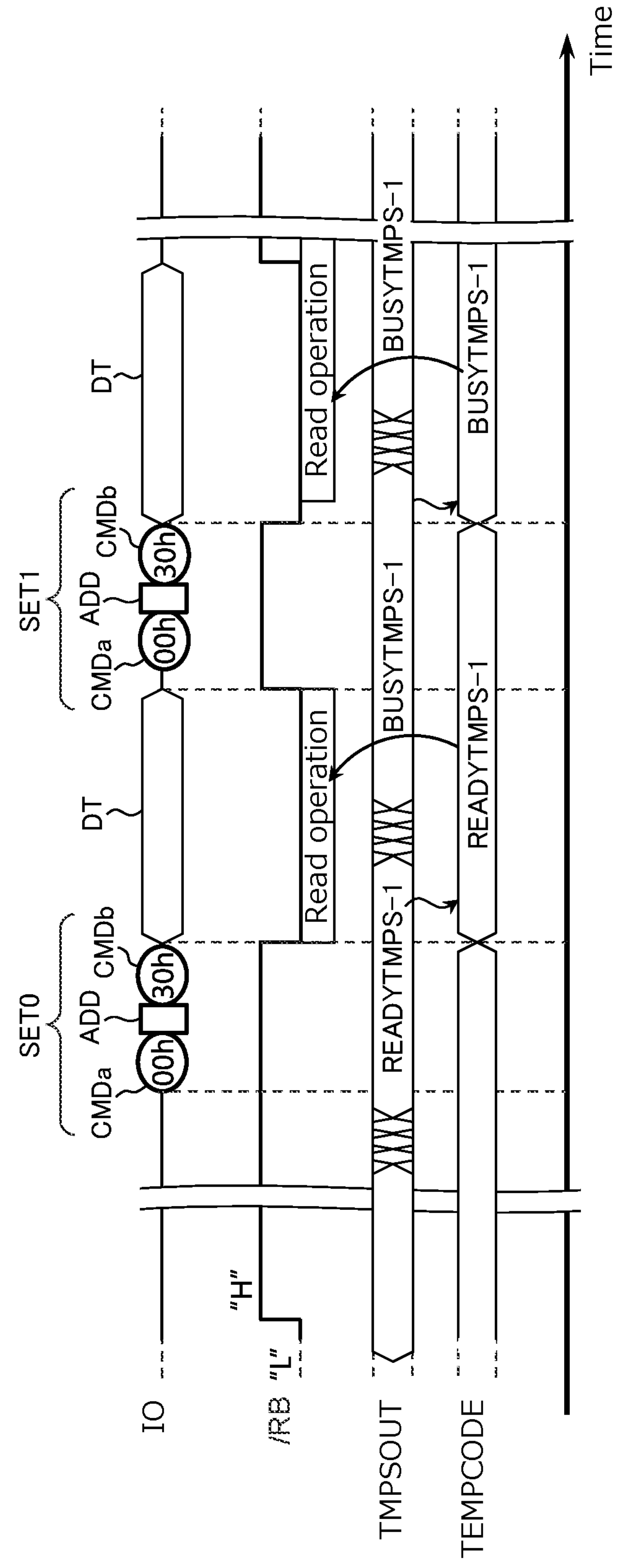

The following is an explanation of a specific example/modification of operations of the flash memory according to the present embodiment with reference to FIG. 12.

The flash memory according to the present embodiment determines parameters (setting conditions) of the operation corresponding to the received command set using a measurement value (hereinafter referred to as "temperature code") of the temperature acquired during the period (the ready period) of receiving a certain command set, or a measurement value of the temperature acquired during the operation (the busy period) corresponding to the previous command set before the certain command set.

Various voltages to perform the operation corresponding to the command are set on the basis of the temperature code. In this manner, the voltage value of the voltage used for the operation can be corrected in accordance with the temperature of the memory chip.

FIG. 12 is a diagram illustrating a specific example/modification of the flash memory according to the present embodiment.

FIG. 12 schematically illustrates a timing chart in a specific example/modification of the flash memory according to the present embodiment.

As illustrated in FIG. 12, the command CMDa, the address ADD, and the command CMDb are sequentially transferred from the controller 8 to the flash memory 1. During the period of transferring the command set SET0 including the commands CMD (CMDa, CMDb) and the address ADD, the signal/RB is set to level "H". The flash memory is in the ready state.

During the period in which the flash memory 1 is in the ready state, the temperature sensor 41 measures the temperature of the memory chip 20, in each of the memory chips 20 of the flash memory 1. In this manner, the values TMPSOUT indicating the temperatures of the respective memory chips 20 are acquired. The temperature codes TEMPCODE are set on the basis of the acquired values.

Operation parameters (such as the voltage value) are selected on the basis of the temperature code TEMPCODE corresponding to the temperature value READYTMPS-1 in the ready state.

After decoding the command CMD and the address ADD, the flash memory 1 starts a read operation corresponding to the command set SET0. The sequencer 124 changes the signal level of the ready/busy signal/RB from level "H" to level "L". The flash memory 1 is changed to the busy state.

The operation parameters set on the basis of the temperature code TEMPCODE corresponding to the value READYTMPS-1 are reflected on various voltages used for the read operation. In this manner, the read operation is performed.

During the busy state (the period in which the level of the signal/RB is level "L"), the temperature of each of the memory chips in operation may be measured. In this case, the temperature code TEMPCODE to be used for the operation of the command set SET1 received next can be set, on the basis of the temperature values BUSYTMPS-1 during the busy state (during the operation corresponding to the command set SET0).

When the temperature is measured during the ready period and the busy period, measurement of the temperature and setting of the temperature code may be performed by periodical patrol with a timer provided inside the flash memory. As another example, a plurality of select options relating to the timing of temperature measurement may be set in the flash memory 1 such that the temperature codes are acquired at the start of the busy period in accordance with the operation mode of the flash memory (and the memory system) and operation parameters based on the temperature codes are reflected on the operation to be performed.

As described above, the flash memory 1 according to the present embodiment is capable of suppressing prolonged operation due to setting of the temperature code and the operation parameters by acquiring temperature values of the chips in the ready state and/or the busy state.

<Address Transfer>

Figure 13:
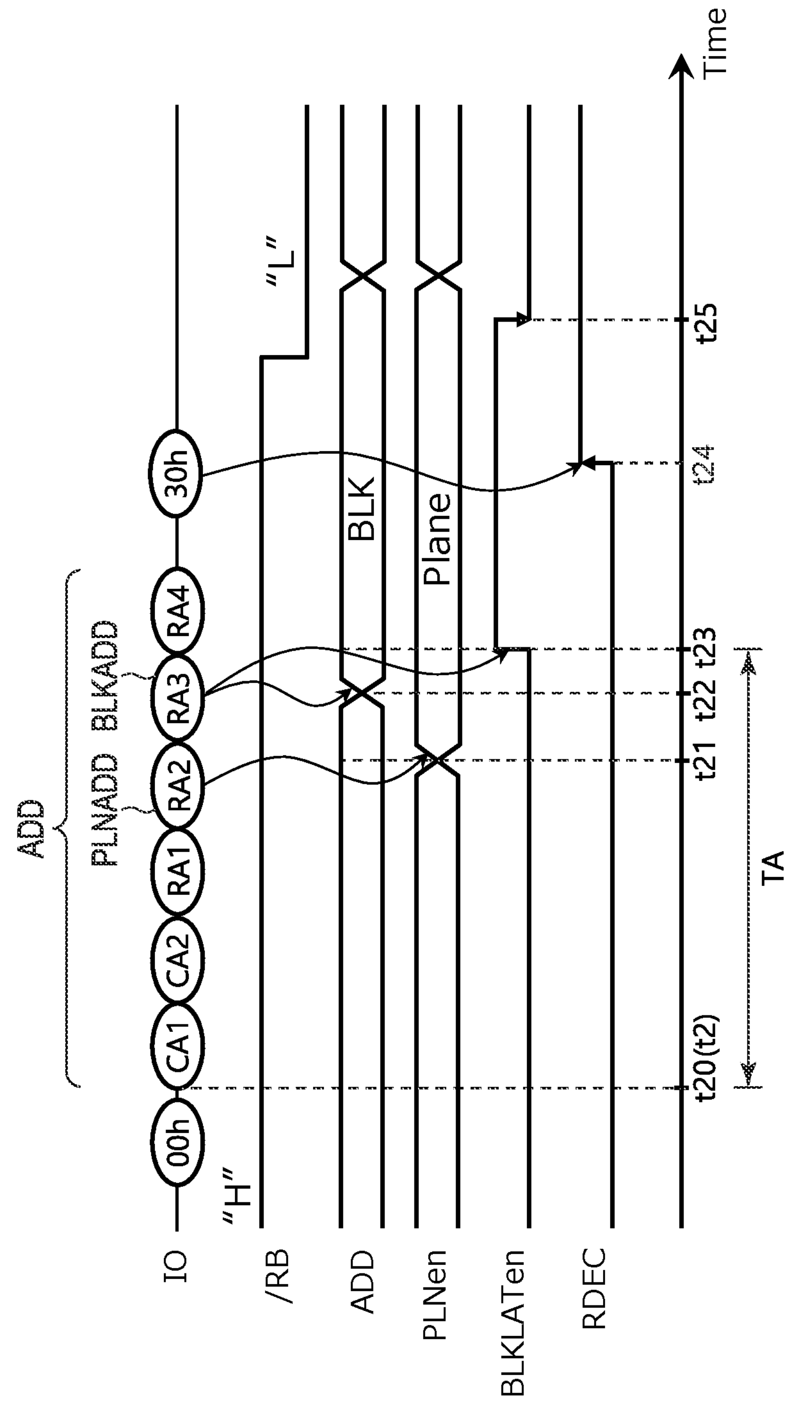

The following is an explanation of a specific example/modification of operations of the flash memory according to the present embodiment with reference to FIG. 13.

FIG. 13 is a diagram illustrating a specific example/modification of operations of the flash memory according to the present embodiment.

FIG. 13 illustrates a timing chart of operations of the flash memory in a specific example/modification of the flash memory according to the present embodiment.

As described above, in a period TA in the ready period, the address ADD is transferred as data of five cycles (or six cycles) from the controller 8 to the flash memory 1.

In data of the first cycle and the second cycle of the address ADD, the flash memory 1 receives column addresses CA1 and CA2. The flash memory 1 decodes the received column addresses CA1 and CA2.

In data of the third cycle, the fourth cycle, the fifth cycle, and the sixth cycle of the address, the flash memory 1 receives row addresses RA1, RA2, RA3, and RA4. The flash memory 1 decodes the received row addresses RA1, RA2, RA3, and RA4. For example, data RA2 of the fourth cycle includes a plane address PLNADD. For example, data RA3 of the fifth address includes a block address BLKADD.

As illustrated in FIG. 13, in this example, the flash memory 1 according to the present embodiment activates a signal PLNen in synchronization with the timing of reception of the plane address (data of the fourth cycle) PLNADD in the address ADD. At time t21, the sequencer 124 sets the signal (hereinafter also referred to as "plane enable signal") to an enable state.

In this manner, in the ready period, the plane corresponding to the address PLNADD can be set to the enable state on the basis of the timing of acquisition (reception and/or decoding) of the plane address PLNADD. The flash memory 1 of the present embodiment activates a control signal BLKLATen in synchronization with the timing of acquisition of the block address (data of the fifth cycle) BLKADD in the address ADD. At time t22 in the ready period, the sequencer 124 changes the signal level of the control signal BLKLATen from level "L" to level "H".

This operation enables transfer of the decode result of the block address BLKADD from the sequencer 124 to the plane PLN during the ready period. The latch circuit (address latch) in the plane PLN can be set to a state of being capable of storing the transferred block address BLKADD.

The command CMDa of "30h" is transferred from the controller 8 to the flash memory 1. The flash memory 1 of the present embodiment activates a signal RDEC in synchronization with the timing of acquisition (reception and/or decoding) of the command CMDa. At time t24 in the ready period, the sequencer 124 changes the signal level of the signal RDEC from level "L" to level "H".

With the signal RDEC of the level "H", the row decoder 112 is activated during the ready period of the flash memory 1. The row decoder 112 is changed to a state of being capable of starting an operation.

As described above, the flash memory 1 according to the present embodiment is capable of activating the row decoder 112 in the ready period TRY by controlling an internal control signal in synchronization with acquisition (reception and/or decoding) of the row address.

<Internal Operation of Memory Cell Array>

Figure 15:
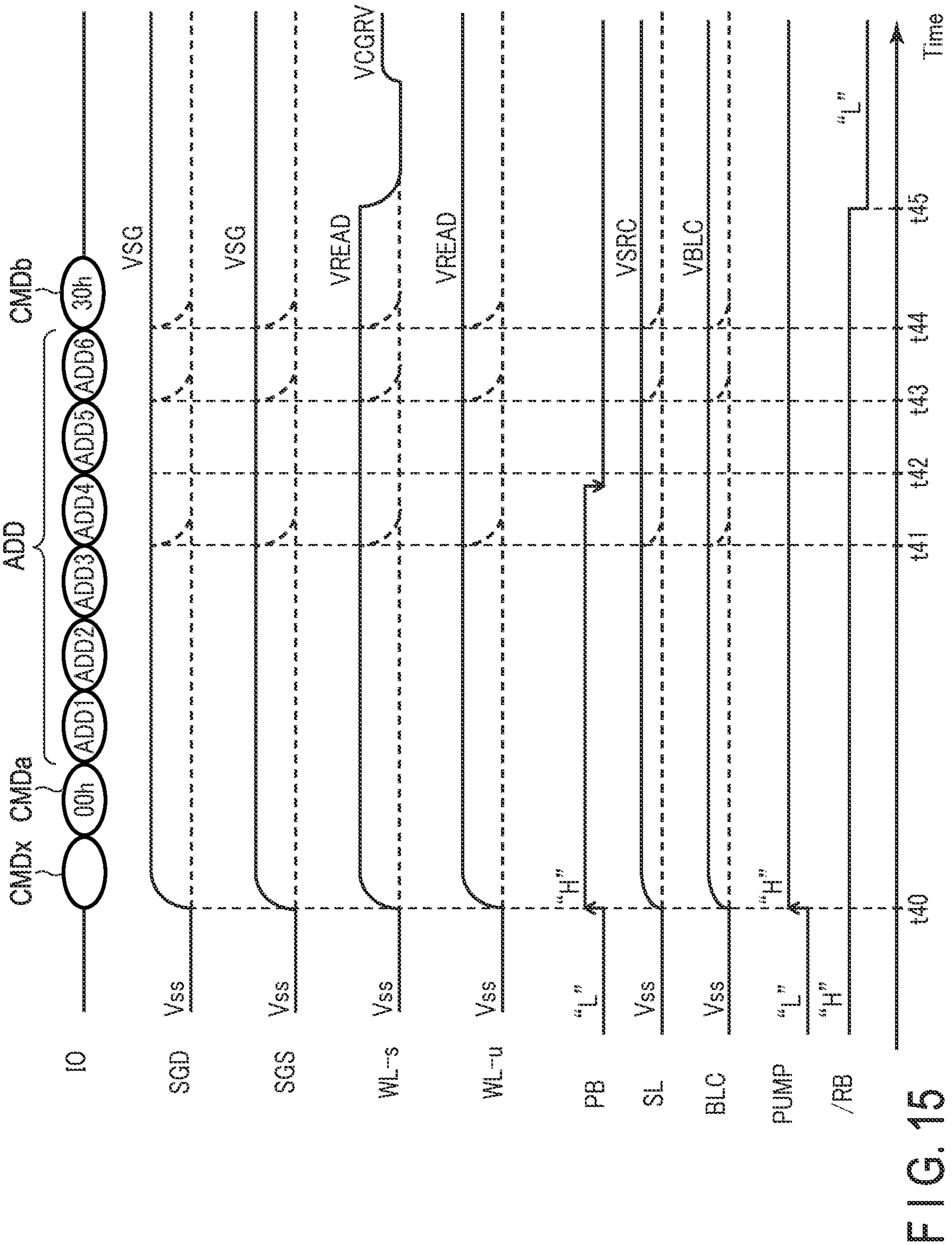

The following is an explanation of a specific example of operations of the memory device according to the present embodiment, with reference to FIG. 14 and FIG. 15.

FIG. 14 is a timing chart for explaining a specific example of operations of the core circuit (plane) in the memory device according to the present embodiment.

As described below, voltages may be applied to the word lines, the bit lines, and the select gate lines in the memory cell array.

[Time t30]

As illustrated in FIG. 14, the flash memory 1 sequentially receives the prefix command CMDx, the command CMDa, the address ADD, and the command CMDb.

At time t30, the sequencer 124 changes the signal level of the signal PB from "L" level to "H" level on the basis of the received prefix command CMDx. In this manner, one or more planes PLN is activated. The signal PB is a control signal for the planes PLN. For example, the signal PB corresponds to the plane enable signal PLNen described above. The signal PB may be a signal set including the plane enable signal PLNen.

The sequencer 124 changes the signal level of the control signal PUMP for the charge pump 50 from "L" level to "H" level. In this manner, the charge pump 50 of the voltage generation circuit 125 generates voltages used for the operation corresponding to the command.

Thereafter, the flash memory 1 successively receives and decodes the address ADD.

[Time t31]

At time t31, the flash memory 1 receives data of the fifth cycle of the address ADD. The data of the fifth cycle includes a block address.

The address of the plane is determined with the data of the fourth cycle. For this reason, the sequencer 124 changes the signal level of the signal PB from "H" level to "L" level. In this manner, non-selected planes are set to the non-selected state.

[Time t32]

After receiving data of the fifth cycle of the address ADD, the flash memory 1 receives the command CMDb of "30h".

At time t32, the row decoder 112 in the selected plane activates the selected select gate lines SGD and SGS, the selected word line WL-s and non-selected word lines WL-u on the basis of the address.

The sense amplifier module 113 in the selected plane changes the potential (signal level) of the control signal BLC from a voltage value Vss to a voltage value VBLC. A clamp transistor of the sense amplifier module 113 is set to the on state. In this manner, the bit lines BL are activated.

A voltage VSRC is applied to the source line SL.

In a read operation, the row decoder 112 transfers a voltage VSG to the selected select gate lines SGD and SGS. By application of the voltage VSG, the select transistors ST1 and ST2 are set to the on state. In a read operation, the row decoder 112 transfers a non-selection voltage VREAD to the selected word line WL-s and non-selected word lines WL-u. In this manner, the non-selection voltage VREAD is applied to the word lines WL-s and WL-u. With the non-selection voltage VREAD, the memory cells MC are set to the on state without depending on the data retaining state.

At time t32, the non-selection voltage may be applied to the word lines WL-s and WL-u, after a voltage VX lower than the non-selection voltage VREAD is applied.

[Time t33]

At time t33, the sequencer 124 changes the signal level of the ready/busy signal/RB from "H" level to "L" level. In this manner, the flash memory 1 is set to the busy state.

After the potential of the selected word line WL-s is changed from the voltage VREAD to a ground voltage Vss, the row decoder 112 transfers a read voltage VCGRV to the selected word line WL-s. In this manner, the read voltage VCGRV is applied to the selected word line WL-s. For example, the read voltage VCGRV may be a voltage including two or more read levels.

Each of the selected cells connected to the selected word line WL-s is set to the on state, or maintains the off state, in accordance with the data (threshold voltage of the selected cell) in the selected cell. When the selected cell is in the on state, a current occurs in the corresponding bit line (or the potential of the bit line is changed). When the selected cell is in the off state, no current occurs in the corresponding bit line (or the potential of the bit line is not substantially changed).

The sense amplifier module 113 senses presence/absence (or change in potential of the bit line) of occurrence of a current in each of the bit lines BL. The data stored in the corresponding selected cell is discriminated in accordance with the sense result.

As described above, data is read from the selected address in the flash memory 1 according to the present embodiment.

The data is transferred from the flash memory to the controller 8.

In this manner, a read operation of the flash memory according to the present embodiment is completed.

FIG. 15 is a timing chart for explaining an example different from the example of FIG. 14, in the read operation of the flash memory according to the present embodiment.

As described above, the selected address is determined in the flash memory 1 in the order of the word line address, the block address, the plane address, and the chip address. In the example of FIG. 14, at the point in time when the address value of the selected word line is determined, a plurality of word lines corresponding to the address value of the determined word line address are activated in a plurality of planes, a plurality of blocks, and a plurality of chips, regardless of the address of the plane PLN.

[Time t40]

As illustrated in FIG. 15, at time t40, the signal level of the signal PB and the signal level of the signal PUMP are set to "H" level in response to reception of the command CMDx.

In this example, before the row address is determined, the non-selection voltage VREAD is applied to a plurality of word lines WL-s and WL-u of a plurality of planes PLN and a plurality of chips 20 of the flash memory 1. The voltage VSG is applied to a plurality of select gate lines SGD and SGS of a plurality of planes PLN and a plurality of chips 20.

The potential of the signal BLC is set to a voltage VBLC (>Vss). The potential of the source line SL is set to VSRC (>Vss).

[Time t41]

After the address of the plane PLN serving as the operation target is determined by reception of data of the fourth cycle of the address ADD, at time t41, the sequencer 124 changes the potential of the word line WL-u in each of the non-selected planes PLN from the voltage VREAD to the ground voltage Vss, on the basis of the plane address. The sequencer 124 changes the potentials of the select gate lines SGD and SGS in each of the non-selected planes from the voltage VSG to the ground voltage Vss.

The sequencer 124 changes the potential of the signal BLC of each of the non-selected planes from the voltage VBLC to the ground voltage Vss. The sequencer 124 changes the potential of the source line SL in each of the non-selected planes from the voltage VSRC to the ground voltage Vss.

As described above, when the plane address is acquired, the ground voltage Vss is applied to the word line WL, the select gate lines SGD and SGS and the source line SL in each of the non-selected planes. In the non-selected planes, the signal level of the signal BLC is set to the ground voltage Vss.

In one or more planes having the same value as the value of the determined plane address, applying the voltage VREAD to the word line WL-u, applying the voltage VSG to the select gate lines SGD and SGS, and applying the voltage VSL to the source line CELSRC are continued. The potential of the signal BLC is maintained at the voltage VBLC.

[Time t42]

At time t42, the sequencer 124 changes the signal level of the signal PB from "H" level to "L" level.

At time t42, supply of the voltage to the interconnects of the non-selected blocks may be stopped on the basis of data of the fifth cycle of the address ADD including the received block address.

[Time t43]

After reception of data of the fifth cycle of the address ADD including the block address, at time t43, the flash memory 1 receives data of the sixth cycle of the address ADD. The data of the sixth cycle includes a chip address.

In this manner, after the address of the chip serving as the operation target is determined, the sequencer 124 changes the potential of the word line WL-u of each of the non-selected chips from the voltage VREAD to the ground voltage Vss, on the basis of the chip address. The sequencer 124 changes the potentials of the select gate lines SGD and SGS of each of the non-selected chips from the voltage VSG to the ground voltage Vss. The sequencer 124 changes the potential of the signal BLC of each of the non-selected chips from the voltage VBLC to the ground voltage Vss. The sequencer 124 changes the potential of the source line SL of each of the non-selected chips from the voltage VSRC to the ground voltage Vss.

As described above, when the chip address is determined, the ground voltage Vss is applied to the word line WL, the select gate lines SGD and SGS, and the source line SL, in each of the non-selected chips. In each of the non-selected chips, the signal level of the signal BLC is set to the ground voltage Vss.

In the chip (selected chip) corresponding to the determined chip address, applying the voltage VREAD to the word line WL-u, applying the voltage VSG to the select gate lines SGD and SGS, and applying the voltage VSL to the source line CELSRC are continued. The potential of the signal BLC is maintained at the voltage VBLC.

As a result, the voltages VREAD, VSG, and VSL for the read operation are applied to the interconnects WL-s, WL-u, SGD, SGS, and SL, respectively, corresponding to the selected plane in the selected chip. The potential of the signal BLC is maintained at the voltage VBLC.

[Time t44]

After reception of the address ADD, at time t44, the flash memory 1 receives the command CMDb. The flash memory 1 decodes the command CMDb. The operation to be performed is determined on the basis of the decoding result of the command.

In this example, in substantially the same manner as the example of FIG. 14, after the ready/busy signal/RB is set to level "L" (time t45), the read operation is performed on the basis of the decoding result of the command "30h". The read voltage VCGRV is applied to the selected word line WL-s. In this manner, data is read.

By contrast, on the basis of the decoding result of the command, when it is determined that the operation to be performed is an operation other than the read operation, the potentials of the interconnects WL-s, WL-u, SGD, SGS, and SL are changed from the voltage VREAD to the ground voltage Vss. Thereafter, various voltages used for the operation corresponding to the decoding result of the command are applied to the word line, the select gate lines, and the source line SL. In this manner, the operation corresponding to the decoding result of the command is performed.

As described above, the operation corresponding to the example of FIG. 15 is ended.

As illustrated in FIG. 15, in the flash memory according to the present embodiment, a voltage may be speculatively supplied to a plurality of planes (memory cell array) before the selected address is determined, to increase the speed of the operation (such as a read operation) of the flash memory.

As illustrated in FIG. 14 and FIG. 15, in the flash memory according to the present embodiment, the voltage used for the operation is supplied into the memory cell array (blocks) before the address is determined.

This structure enables the NAND flash memory according to the present embodiment to increase the speed of the operation.

(c) Conclusion

In the memory device (such as a NAND flash memory) according to the present embodiment, the voltage used for the operation corresponding to the command is generated in parallel with reception (and decoding) of the command and the address. For example, the memory device according to the present embodiment is capable of speculatively applying the generated voltage to the interconnects in the memory cell array in parallel with reception (and decoding) of the command and the address.

The memory device according to the present embodiment enables early execution of the operation to be performed in comparison with the case where generation of the voltage is started after decoding of the address and the command is completed.

This structure enables the memory device according to the present embodiment to shorten the period from reception of the command set to start of the operation corresponding to the command.

As a result, the memory device according to the present embodiment enables improvement in operation speed. Accordingly, the memory device according to the present embodiment improves property.

(2) Second Embodiment

Figure 18:
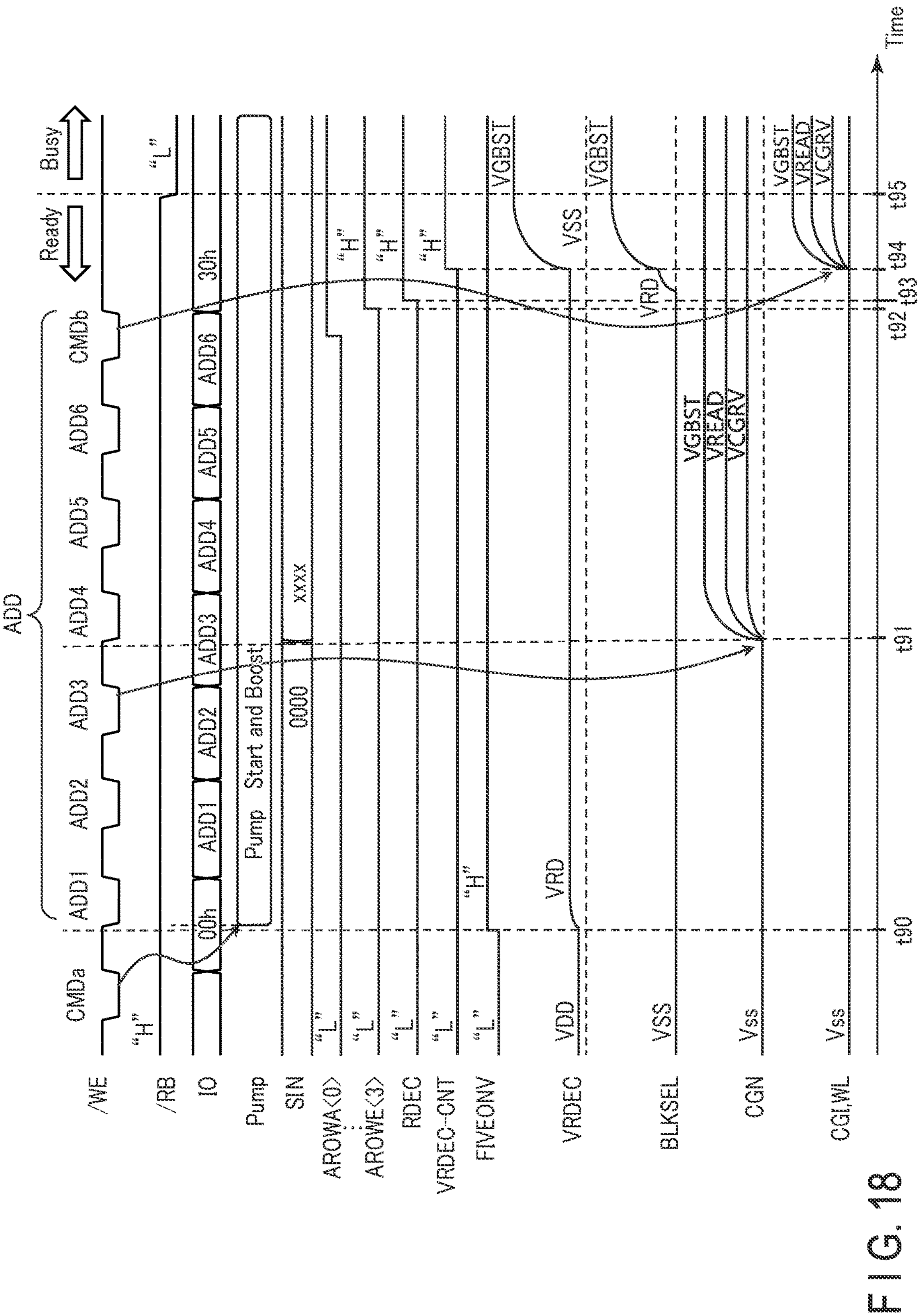
FIG. 18 is a diagram illustrating an operation example of the memory device according to the second embodiment.

The following is an explanation of a memory device and a method for controlling the same according to the second embodiment with reference to FIG. 16 to FIG. 18.

(a) Configuration Example

The following is an explanation of a configuration example of the memory device according to the present embodiment with reference to FIG. 16 and FIG. 17.

FIG. 16 is a circuit diagram illustrating a configuration example of the memory device (such as a NAND flash memory) according to the present embodiment.

A NAND flash memory 1 according to the present embodiment generates voltages used for the operation to be performed, in parallel with reception and decoding of the address, in the same manner as the flash memory according to the first embodiment.

As illustrated in FIG. 16, an input/output circuit 120 successively transfers the word line address (page address) and the block address from the controller 8 to the sequencer 124.

The sequencer 124 starts a voltage generation circuit 125 using a control signal FIVEONV.

The voltage generation circuit 125 includes a plurality of charge pumps 50 and a transfer circuit 55.

The charge pumps 50 operate on the basis of the control signal FIVEONV. The charge pumps 50 generate a plurality of voltages. For example, the charge pumps 50 generate a voltage (voltage value) VUSEL. The charge pumps 50 supply the voltage VUSEL to the transfer circuit 51.

The transfer circuit 51 includes a transfer transistor (transfer gate, switch) TR. The transfer circuit 51 transfers the voltage VUSEL to the row decoder 112 through the transfer transistor TR. The transfer transistor TR supplies the voltage VUSEL to an interconnect CGN. The interconnect CGN is connected to an interconnect CGI in the row decoder 112 through a transfer transistor SW.

Turning on/off of the transfer transistor TR is controlled with a control signal GUSEL. Turning on/off of the transfer transistor SW is controlled with a control signal CGSW.

A driver circuit 126 includes a plurality of drivers 701 and 702.

The driver 701 operates on the basis of a control signal FIVEONV. The driver 701 generates a voltage (voltage value) VRD using a voltage VDD or a voltage VX2. The driver 701 transfers the voltage VRD to the row decoder 112.

The driver 702 receives a voltage VPGMH, a voltage VGBST, and the voltage VRD. The driver 702 outputs a voltage selected from the voltage VPGMH, the voltage VGBST, and the voltage VRD to the row decoder 112, as a voltage VRDEC.

The row decoder 112 includes a decode circuit 60 and a transfer circuit (switch circuit) 61.

The decode circuit 60 includes a level shifter 601. The level shifter 601 receives the voltage VRDEC and the voltage VRD. The level shifter 601 controls the signal level of a signal BLKSEL in accordance with the voltage VRDEC and the voltage VRD.

The transfer circuit 61 supplies the voltage corresponding to the operation to the word lines WL set to the selected state/non-selected state on the basis of the address. The transfer circuit 61 includes a plurality of transfer transistors (transfer gates) TG to correspond to the respective word lines.

Each of the transfer transistors TG transfers the voltage (such as the voltage VUSEL) supplied to the interconnect CGI to the word line WL. Each of the transfer transistors TG is turned on/off in accordance with the signal (selection signal or control signal) BLKSEL supplied to the gate of the transfer transistor TG.

FIG. 17 is a diagram illustrating an example of a circuit configuration of the row decoder in the flash memory according to the present embodiment.

As illustrated in FIG. 17, the row decoder 112 includes the level shifter 601, the transfer circuit 61, and a block address decode circuit 609.

The block address decode circuit 609 includes a plurality of buffers BF1 and BF2 and an AND gate A1.

The AND gate A1 includes a plurality of input terminals. A plurality of signals AROW (AROWa, AROWb, . . . , AROWx) are supplied to the AND gate A1 through the buffers BF1. One signal AROW is supplied to corresponding one input terminal of the input terminals of the AND gate A1. The signal RDEC is supplied to corresponding one input terminal of the AND gate A1. The AND gate A1 executes an AND operation (logical product operation) using the supplied signals AROW and RDEC. The AND gate A1 outputs a result of the AND operation as a signal RDECz.

The signals AROW are supplied to the level shifter 601 through one or more buffers BF1. The signal RDECz is supplied to the level shifter 601 through one or more buffers BF2.

The level shifter 601 includes an AND gate A2, one or more inverters IV, and transistors TRa, TRb, TRc, and TRd.

The AND gate A2 includes a plurality of input terminals. One signal AROW is supplied to corresponding one input terminal of the input terminals of the AND gate A2 through one or more buffers BF1. The signal RDECz is supplied to corresponding one input terminal of the input terminals of the AND gate A2 through one or more buffers BF2.

An output terminal of the AND gate A2 is connected to a node ND1 through one inverter IV.

The AND gate A2 performs an AND operation of the supplied signals AROW and RDECz. The AND gate A2 outputs an output signal serving as a result of the AND operation to the node ND1 through the inverter IV.

One terminal (one of source/drain) of the transistor TRa is connected to the node ND1 through one inverter IV. The other terminal (the other of source/drain) of the transistor TRa is connected to one terminal of the transistor TRb. A gate of the transistor TRa is connected to a node ND2. A voltage VDDX is applied to the node ND2. The voltage VDDX is, for example, equal to the voltage VRD (for example, 2 V to 3 V).

The other terminal of the transistor TRb is connected to a node ND3. A gate of the transistor TRb is connected to the node ND2. The transistor TRb is a high-voltage transistor. The withstand voltage of the transistor TRb is higher than the withstand voltage of the transistor TRa.

One terminal of the transistor TRc is connected to the node ND3. The other terminal of the transistor TRc is connected to one terminal of the transistor TRd. A gate of the transistor TRc is connected to the node ND1.

The other terminal of the transistor TRd is connected to a node ND4. A gate of the transistor TRd is connected to the node ND3. The voltage VRDEC is applied to the node ND4.

The node ND3 is an output node of the signal BLKSEL. The potential of the node ND3 corresponds to the signal level of the signal BLKSEL.

The transfer circuit 61 includes a plurality of transistors TG (TGD, TG0, TGm−1, TGS).

Gates of the transistors TGD, TG0, TGm−1, and TGS are connected to the node ND2.

One terminal of the transistor TGD is connected to the select gate line SGD. The other terminal of the transistor TGD is connected to corresponding one of the interconnects CGI.

The transistors TG0, . . . , TGm−1 are connected to the corresponding word lines. One terminal of the transistor TG0 is connected to the corresponding word line WL0 among the word lines. The other terminal of the transistor TG0 is connected to corresponding one of the interconnects CGI. One terminal of the transistor TGm−1 is connected to the corresponding word line WLm−1 among the word lines. The other terminal of the transistor TGm−1 is connected to corresponding one of the interconnects CGI.

One terminal of the transistor TGS is connected to the select gate line SGS. The other terminal of the transistor TGS is connected to corresponding one of the interconnects CGI.

The transistors TG are set to the on state or the off state, in accordance with the potential (signal level of the signal BLKSEL) of the node ND2. In this manner, the block BLK is set to the selected state or the non-selected state.

In the NAND flash memory 1 according to the present embodiment, the signal BLKSEL to set the block BLK to the activated state (selected state) is activated, with the signal RDEC and the signal AROW corresponding to the row address (block address) serving as a trigger.

In this case, the wait time until the signal BLKSEL is determined is self-aligned with respect to the time until the signal level of the row address converges.

For this reason, the NAND flash memory according to the present embodiment is capable of activating the signal BLKSEL in the period in which the level of the ready/busy signal/RB is level "H".

This structure enables the NAND flash memory according to the present embodiment to increase the speed of the operation.

(b) Operation Example

The following is an explanation of an operation example of the NAND flash memory according to the present embodiment with reference to FIG. 18.

FIG. 18 is a timing chart illustrating an operation example of the NAND flash memory according to the present embodiment.

[Time t90]

As described above, the controller 8 transmits a command set including a command and an address to the flash memory 1, in response to a request from the host device 9. With transmission of the command set, the signal/WE is toggled.

As illustrated in FIG. 18, at time t90, the flash memory 1 receives a command CMDa in synchronization with the toggled signal/WE.

The sequencer 124 activates the signal FIVEONV in synchronization of reception of the command CMDa. The signal level of the signal FIVEONV is changed from "L" level to "H" level. With the signal FIVEONV of "H" level, the voltage generation circuit 125 starts the charge pumps 50 to boost the voltage.

Before reception of the command, the driver 702 outputs the voltage VRDEC with the voltage value VDD.

With the signal FIVEONV of level "H", the charge pumps 50 output a voltage of the voltage value VRD. The driver 701 outputs a voltage VRD of a certain voltage value. In response to it, the driver 702 outputs the voltage VRDEC of the voltage value VRD.

For this reason, at time t90, the value of the voltage VRDEC is changed from the voltage value VDD to the voltage value VRD. For example, by application of the voltage of the voltage value VRD to the node ND2, the inverters and the transistors TRa and TRb are set to the on state.

When the command is received, no address ADD has been received. For this reason, a word line address information code SIN is in a non-specified state. The signals AROW <0> to AROW <x> are set to level "L". The signal RDEC is also set to level "L".

[Time t91]

After reception of the command CMDa, the flash memory 1 according to the present embodiment successively receives the addresses ADD1, ADD2, and ADD3.

For example, at the timing of the address ADD3 of the third cycle, the address of the selected word line WL-S is determined. For this reason, the word line address information code SIN is set to the value corresponding to the word line address.

In accordance with the word line address information code, for example, the voltage VCGRV is applied to the interconnect CGN corresponding to the selected word line. The non-selection voltage VREAD is applied to interconnects CGN corresponding to the non-selected word lines. For example, a voltage VGBST may be applied to one of the interconnects CGN.

[Time t92]

After time t91, the flash memory 1 according to the present embodiment sequentially receives the addresses ADD4, ADD5, and ADD6. The sequencer 124 decodes the received addresses ADD4, ADD5, and ADD6.

In this manner, at time t92, the signal level of each of the decode signals AROW is changed from "L" level to "H" level, in accordance with the received address.

The signals AROW are supplied to the AND gates A1 and A2 in the row decoder of FIG. 17. In this operation, the signal level of the signal RDEC is set to "L" level.

For this reason, the output signals of the AND gates A1 and A2 are at "L" level, even when all the signals AROW have a signal level of "H".

[Time t93]

At time t93, the sequencer 124 changes the signal level of the signal RDEC from "L" level to "H" level.

The signal RDEC of "H" level is supplied to the AND gates A1 and A2. When all the signals AROW and RDEC supplied to the AND gates A1 and A2 have "H" level, the AND gates A1 and A2 output signals of "H" level.

In this manner, the signal level (potential) of the signal BLKSEL increases to the voltage value VRD higher than the ground voltage Vss.

In addition, when the AND gate A2 outputs a signal of "H" level, the potential (signal level of the inverter IV) of the node ND1 is changed from "H" level to "L" level. In this manner, the transistor TRc is set to the on state.

[Time t94]

After reception of the command CNDb, at time t94, the sequencer 124 changes the signal level of the signal VRDEC-CNT from "L" level to "H" level. The signal VRDEC-CNT of level "H" is supplied to the driver circuit 126. After reception (transmission 9 of the command CNDb, the toggle of the signal/WE is stopped.

In response to the signal VRDEC-CNT of "H" level, the driver 702 of the driver circuit 126 outputs the voltage value VGBST. The voltage value of the voltage VRDEC increases from the voltage value VRD to the voltage value VGBST. The voltage value of the node ND4 is transferred to the node ND3 through the transistor TRc and TRd in the non state.

For this reason, the signal level of the signal BLKSEL increases from the voltage value VRD to the voltage value VGBST. In this manner, the voltage value VGBST higher than the voltage value VRD is applied to the gates of the transfer transistors TG.

In the selected block, the voltage of the voltage value VGBST is applied to the gates of the transfer transistors TG. In this manner, the transfer transistors TG are set to the on state.

The read voltage VCGRV and the non-selection voltage VREAD are applied to the interconnects CGI and the word lines WL corresponding to the word line address. The read voltage VCGRV is applied to the interconnect CGI and the word line WL corresponding to the selected word line. The non-selection voltage VREAD is applied to the interconnects CGI and the word lines WL corresponding to the non-selected word lines WL. The voltage VGBST is applied to the predetermined interconnect CGI and the word line WL.

In the present embodiment, when application of the voltages corresponding to the interconnects CGI and the word lines WL is started, the signal level of the ready/busy signal is set to level "H". In this operation, the flash memory 1 according to the present embodiment is in the ready state.

[Time t95]

At time t95, the sequencer 124 changes the signal level of the ready/busy signal from "H" level to "L" level. Thereafter, inside the flash memory 1, data is read from the selected address in the selected block.

Thereafter, the sequencer 124 stops the charge pumps. The potentials of the interconnects CGN, CGI, WL, and BL of the flash memory 1 are set to the ground voltage Vss.

The data is transferred from the flash memory 1 to the controller 8. The sequencer 124 changes the signal level of the ready/busy signal/RB from "L" level to "H" level.

As described above, the read operation of the flash memory according to the present embodiment is completed.

(c) Conclusion

The memory device (such as a NAND flash memory) according to the present embodiment controls a signal to activate the selected block using a decode signal of the address and the control signal of the row decoder.

With this structure, in the present embodiment, the selected block is activated in a self-aligned manner with respect to the timing of determining the address.

In the present embodiment, the selected block is activated in the period (period in which the level of the ready/busy signal is level "H") in which the memory device is in the ready state.

As a result, the memory device according to the present embodiment enables increase in speed of the operation.

As described above, the memory device according to the present embodiment improves the property.

(3) Third Embodiment

Figure 21:
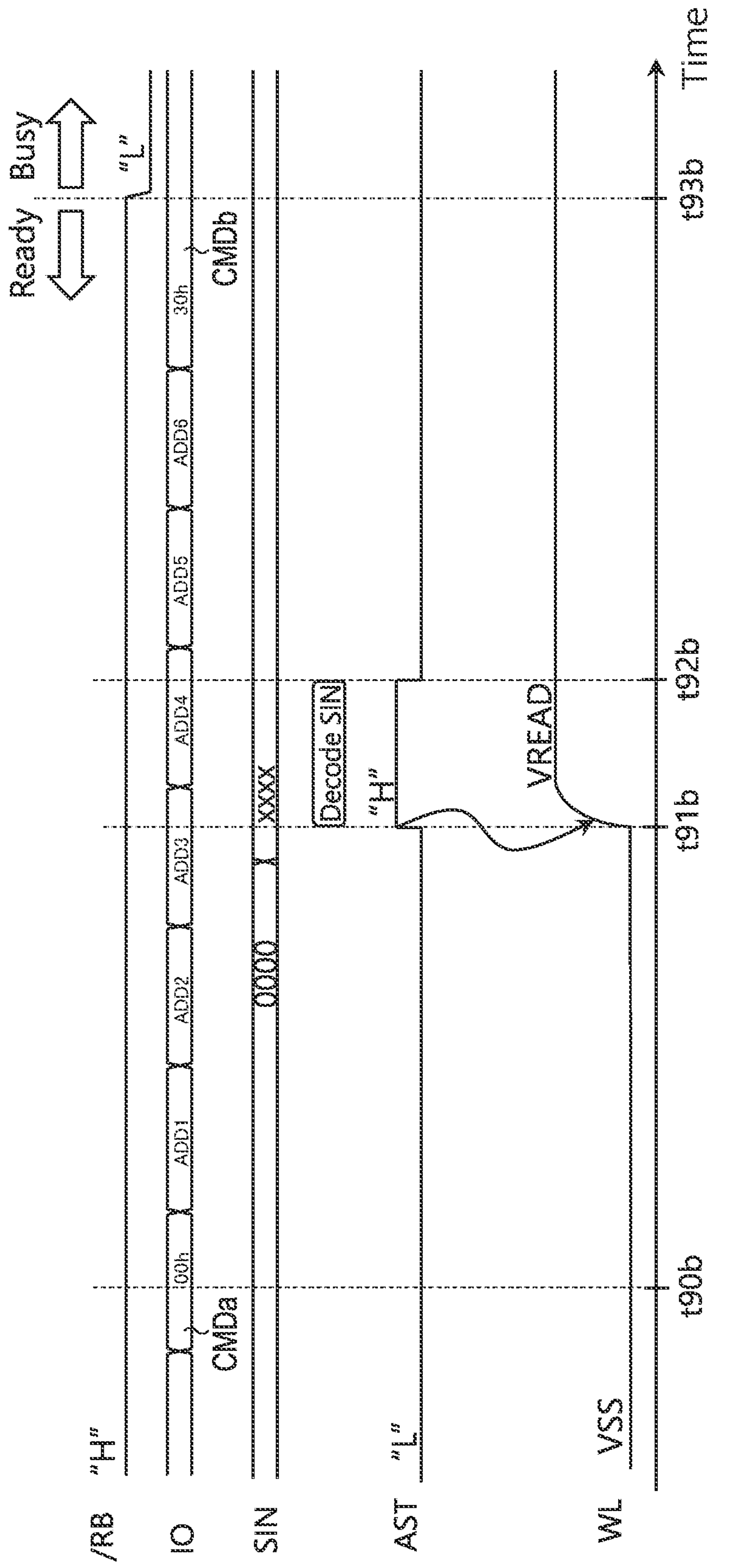

The following is an explanation of a memory device and a method for controlling the same according to the third embodiment with reference to FIG. 19 to FIG. 21.

FIG. 19 is a schematic diagram illustrating a configuration example of a flash memory 1 according to the present embodiment.

The flash memory 1 according to the present embodiment includes a signal AST as a control signal inside the flash memory.

A sequencer 124 outputs a signal AST to a driver circuit 126. The signal AST is a signal to activate the driver circuit 126. For example, the signal level of the signal AST is controlled in synchronization with the timing of decoding the word address information code SIN.

FIG. 20 is a timing chart for explaining an operation example of the NAND flash memory according to the present embodiment.

As described above, in the period in which the level of the ready/busy signal is "H" level, the flash memory 1 according to the present embodiment generates, with the voltage generation circuit 125, voltages used for the operation to be performed, in parallel with decoding of the command/address.

The sequencer 124 changes the signal level of the signal AST from "L" level to "H" level, in the period (before setting of the code SIN) of decoding the word line address information.

In response to the signal AST of level "H", the driver circuit 126 is activated. At the timing at which the signal AST is set from "L" level to "H" level, the driver circuit 126 transfers a voltage VX to the word lines.

In this manner, the potentials of the word lines WL increase from the ground voltage Vss to the voltage VX.

The sequencer 124 changes the signal level of the signal AST from "H" level to "L" level in synchronization with end of decoding of the code SIN of the word line address information.

In response to change in potential of the signal AST from "H" level to "L" level, the voltage generation circuit 125 outputs a voltage VREAD. The voltage generation circuit 125 supplies the generated voltage VREAD to the word lines WL (interconnects CGI). In this manner, the potentials of the word lines WL increase from the voltage VX to the non-selection voltage VREAD.

As described above, the potentials of the word lines WL are set from the ground voltage Vss to the predetermined voltage.

After the ready/busy signal is changed from level "H" to level "L", a read voltage VCGRV is applied to the selected word line WL. In this manner, data is read from the selected cells.

FIG. 21 is a timing chart illustrating a modification of the operation example of FIG. 19.

As illustrated in FIG. 21, the potentials of the word lines WL (interconnects CGI) may be set to the non-selection voltage VREAD using the timing of change of the signal AST, without change in potentials over a plurality of steps.

As illustrated in FIG. 21, the driver circuit 126 is activated at the timing at which the signal level of the signal AST is changed to level "H".

The driver circuit 126 supplies the voltage VREAD to the word lines WL. In this manner, the potentials of the word lines WL increase from the voltage Vss to the non-selection voltage VREAD.

In synchronization with end of decoding of the code SIN, the signal level of the signal AST is changed from level "H" to level "L". The potentials of the word lines WL are maintained at the non-selection voltage VREAD.

After the ready/busy signal/RB is changed to level "L", data is read from the selected cells by application of the read voltage VCGRV.

As illustrated in FIG. 19 to FIG. 21, the flash memory according to the present embodiment is capable of supplying a certain voltage to the word lines in the period of decoding the address information of the word line.

As a result, the flash memory according to the present embodiment is capable of shortening the period from reception of the command to start of read of data.

Accordingly, the memory device according to the present embodiment improves the property of the memory.

(4) Others

The embodiments described above illustrate NAND flash memory as an example of the memory devices of the embodiments. However, the memory devices of the embodiments may be memory devices other than NAND flash memory. For example, the memory devices of the embodiments may be NOR flash memory, DRAM, SRAM, magnetoresistive memory (such as MRAM and/or STT-MRAM), resistive random access memory (such as ReRAM), and phase-change memory (such as PCRAM and/or PCM).

In the embodiments described above, the term "connect" is not limited to the case where a plurality of constituent elements are directly connected, but also includes the case where another conductive element is interposed between the constituent elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
- a memory cell array including a plurality of word lines;
- a voltage generation circuit generating one or more voltages supplied to the memory cell array;
- an input/output circuit receiving a first command and an address indicating a region in the memory cell array; and
- a control circuit controlling a read operation to the memory cell array based on the first command,
- wherein the control circuit supplies a non-selection voltage of the voltages to each of the plurality of word lines before a ready/busy signal changes from a ready state to a busy state, and
- wherein the control circuit supplies a read voltage to a selected word line among the plurality of word lines in the read operation, the non-selection voltage being higher than the read voltage.

2. The memory device according to claim 1, wherein the read voltage is supplied to the selected word line after the ready/busy signal changes from the ready state to the busy state.

3. The memory device according to claim 1, wherein the non-selection voltage is supplied to each of the plurality of word lines after all parts of the address are received.

4. The memory device according to claim 1, wherein the non-selection voltage is supplied to each of the plurality of word lines before all parts of the address are received.

5. The memory device according to claim 1, wherein a first voltage lower than the non-selection voltage is supplied to one of the plurality of word lines after supplying the non-selection voltage, during reception of the address.

6. The memory device according to claim 1, further comprising:
- a plurality of first interconnects electrically connected to the voltage generation circuit,
- wherein the non-selection voltage is supplied to each of the plurality of first interconnects before the ready/busy signal changes from the ready state to the busy state.

7. The memory device according to claim 1, further comprising:
- a plurality of first interconnects electrically connected to the voltage generation circuit,
- wherein the non-selection voltage is supplied to each of the plurality of first interconnects during reception of the address.

8. The memory device according to claim 1, further comprising:
- a plurality of second interconnects, each of the plurality of second interconnects being electrically connected to a corresponding one of the plurality of word lines,
- wherein the non-selection voltage is supplied to each of the plurality of second interconnects before the ready/busy signal changes from the ready state to the busy state.

9. The memory device according to claim 1, further comprising:
- a plurality of second interconnects, each of the plurality of second interconnects being electrically connected to corresponding one of the plurality of word lines,
- wherein the non-selection voltage is supplied to each of the plurality of second interconnects after all parts of the address are received.

10. The memory device according to claim 1, wherein the control circuit starts supply of the voltages to the memory cell array based on a second command received before the first command.

11. The memory device according to claim 1, wherein:
- the control circuit supplies the voltages to the plurality of word lines during reception of the address, and
- after reception of a word line address in the address, the control circuit stops supply of the non-selection voltage to the selected word line corresponding to the word line address in the address and continues supply of the non-selection voltage to one or more unselected word lines other than the selected word line.

12. The memory device according to claim 1, wherein:

a current flows in an interconnect connected to the memory cell array, the current has a first current value in a first period of reception of the address, the current has a second current value in a second period in which the voltages are supplied to the memory cell array, and the first current value is higher than the second current value.

13. The memory device according to claim 12, wherein:

the current has a third current value in a third period in which the ready/busy signal indicates the busy state, and the third current value is equal to or less than the second current value.

14. The memory device according to claim 1, further comprising:

a temperature sensor measuring a temperature of a chip including the memory cell array, wherein the control circuit uses the temperature measured before reception of the address to set voltage values of the voltages generated with the voltage generation circuit.

15. The memory device according to claim 14, wherein:

the temperature sensor acquires a first temperature in a period of the read operation, and the control circuit executes another read operation based on a third command supplied after the read operation, using the voltage values of the voltages set based on the first temperature.

16. The memory device according to claim 14, wherein the temperature sensor periodically measures the temperature in a first period in which the ready/busy signal indicates the ready state and a second period in which the ready/busy signal indicates the busy state.

17. The memory device according to claim 1, wherein the control circuit speculatively starts supply of the voltages to the memory cell array before completion of decoding of the address.

18. The memory device according to claim 1, wherein the memory cell array includes a memory cell including a charge storage layer.

19. The memory device according to claim 1, wherein the memory device is a NAND flash memory.

* * * * *